United States Patent
Liaw

(10) Patent No.: US 11,114,366 B2
(45) Date of Patent: Sep. 7, 2021

(54) SEMICONDUCTOR STRUCTURE WITH BURIED CONDUCTIVE LINE AND METHOD FOR FORMING THE SAME

(71) Applicant: Taiwan Semiconductor Manufacturing Co., Ltd., Hsinchu (TW)

(72) Inventor: Jhon-Jhy Liaw, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 53 days.

(21) Appl. No.: 16/589,263

(22) Filed: Oct. 1, 2019

(65) Prior Publication Data

US 2021/0098338 A1  Apr. 1, 2021

(51) Int. Cl.
| H01L 23/48 | (2006.01) |
| H01L 29/06 | (2006.01) |
| H01L 27/092 | (2006.01) |
| H01L 21/768 | (2006.01) |
| H01L 21/8238 | (2006.01) |

(52) U.S. Cl.
CPC ...... *H01L 23/481* (2013.01); *H01L 21/76802* (2013.01); *H01L 21/76877* (2013.01); *H01L 21/823821* (2013.01); *H01L 21/823871* (2013.01); *H01L 27/0924* (2013.01); *H01L 29/0649* (2013.01)

(58) Field of Classification Search
CPC .............. H01L 23/481; H01L 29/0649; H01L 21/823871; H01L 21/76877; H01L 21/76802; H01L 27/0924; H01L 21/823821

See application file for complete search history.

(56) References Cited

U.S. PATENT DOCUMENTS

| 10,840,146 | B1* | 11/2020 | Paul | H01L 21/02532 |
| 2013/0181297 | A1 | 7/2013 | Liaw | |
| 2018/0144788 | A1 | 5/2018 | Liaw | |
| 2019/0080969 | A1* | 3/2019 | Tsao | H01L 21/823821 |
| 2020/0126987 | A1* | 4/2020 | Rubin | H01L 21/76897 |
| 2020/0194372 | A1* | 6/2020 | Cheng | H01L 27/092 |

* cited by examiner

*Primary Examiner* — Karen Kusumakar
*Assistant Examiner* — Adam S Bowen
(74) *Attorney, Agent, or Firm* — McClure, Qualey & Rodack, LLP

(57) ABSTRACT

A semiconductor structure is provided. The semiconductor structure includes a first well region over a substrate, and an isolation structure over the first well region. The semiconductor structure also includes a first transistor over the first well region, and a first buried conductive line over the first well region and electrically connected to a source structure of the first transistor. A top surface of the first buried conductive line is substantially level with or lower than a top surface of the isolation structure.

20 Claims, 26 Drawing Sheets

SEMICONDUCTOR STRUCTURE WITH BURIED CONDUCTIVE LINE AND METHOD FOR FORMING THE SAME

BACKGROUND

Integrated circuits (ICs) have become increasingly important. Applications using ICs are used by millions of people. These applications include cell phones, smartphones, tablets, laptops, notebook computers, PDAs, wireless email terminals, MP3 audio and video players, and portable wireless web browsers. Integrated circuits increasingly include powerful and efficient on-board data storage and logic circuitry for signal control and processing.

The recent trend in miniaturizing ICs has resulted in smaller devices which consume less power, yet provide more functionality at higher speeds than before. The miniaturization process has also resulted in various developments in IC designs and/or manufacturing processes to ensure the desired production yield and the intended performance.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 10C-2 illustrates a cross-sectional view of the cell array along line C-C' of FIG. 9C, in accordance with some embodiments of the disclosure.

DETAILED DESCRIPTION

Figure 1A:
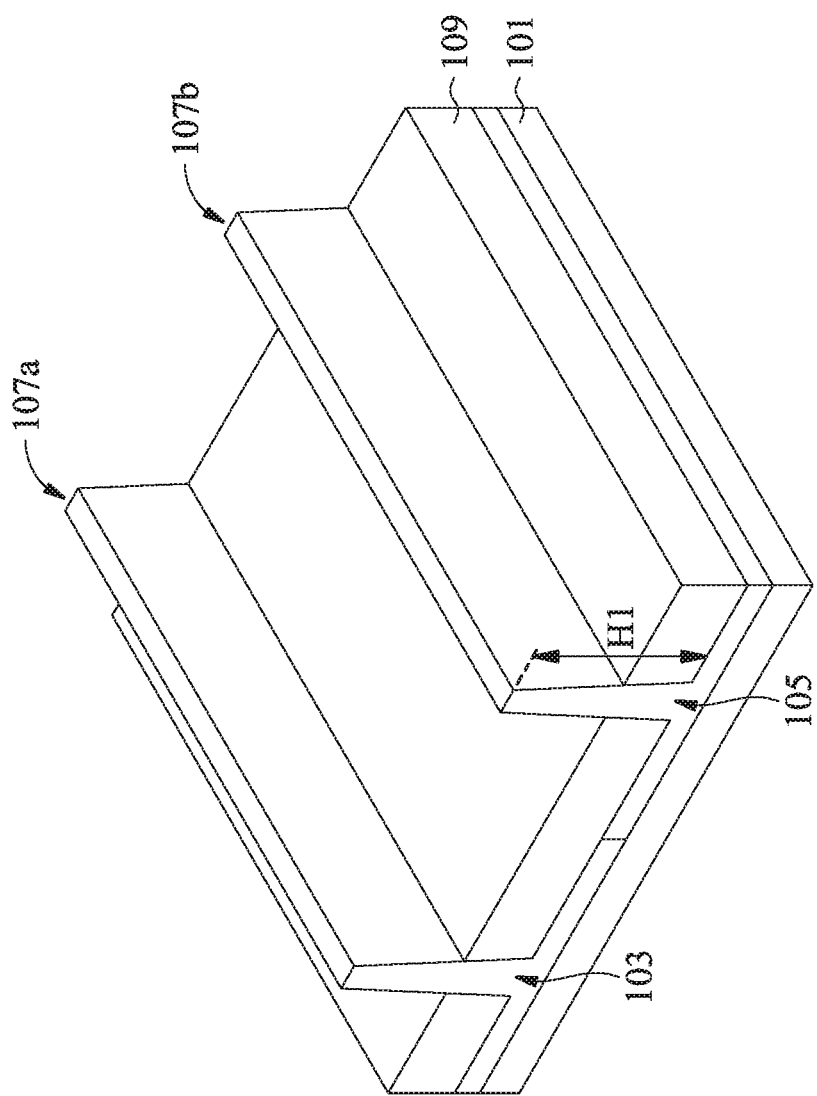
FIGS. 1A to 1F illustrate perspective views of various stages of a process for forming a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various semiconductor structures of integrated circuits (ICs) are provided in accordance with various exemplary embodiments. Some variations of some embodiments are discussed. Throughout the various views and illustrative embodiments, like reference numbers are used to designate like elements.

Embodiments of a semiconductor structure are provided. The semiconductor structure may include a first well region over a substrate, and an isolation structure and a first transistor over the first well region. The semiconductor structure may also include a first buried conductive line over the first well region and electrically connected to a source structure of the first transistor, and the top surface of the first buried conductive line is substantially level with or lower than the top surface of the isolation structure. By using the first buried conductive line to electrically connect the source structure of the first transistor, the routing flexibility may be improved, latch up immunity may be enhanced, and well strap area may be saved.

FIGS. 1A to 1F illustrate perspective views of various stages of a process for forming a semiconductor structure 100a, in accordance with some embodiments of the disclosure.

A substrate 101 is provided, as shown in FIG. 1A in accordance with some embodiments. The substrate 101 may be a semiconductor wafer such as a silicon wafer. Alternatively or additionally, the substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. In some embodiments, the substrate 101 includes an epitaxial layer. For example, the substrate 101 has an epitaxial layer overlying a bulk semiconductor.

An N-type well region 103 and a P-type well region 105 are formed in the substrate 101, a fin structure 107a is formed over the N-type well region 103, and a fin structure 107b is formed over the P-type well region 105, as shown in FIG. 1A in accordance with some embodiments. In some embodiments, the N-type well region 103 is adjacent to the P-type well region 105. More specifically, the N-type well region 103 and the P-type well region 105 are formed by ion implantation processes, in accordance with some embodiments. In some embodiments, the N-type well region 103 is doped with n-type dopants, such as phosphorus or arsenic. In some embodiments, the P-type well region 105 is doped with p-type dopants, such as boron or $BF_2$.

In some embodiments, the longitudinal direction of the fin structure 107a is substantially parallel to the longitudinal direction of the fin structure 107b. Within the context of this specification, the word "substantially" means preferably at least 90%, more preferably 95%, even more preferably 98%, and most preferably 99%. In addition, in some embodiments, the fin structures 107a and 107b are formed by deposition process, patterning process and etching process. For example, a dielectric layer (not shown) is formed over the substrate 101, a mask layer (not shown) is formed over the dielectric layer, and a patterned photoresist layer (not shown) is formed over the mask layer.

The patterned photoresist layer may be formed by a deposition process and a subsequent patterning process. The deposition process for forming the patterned photoresist layer may include a chemical vapor deposition (CVD) process, a high-density plasma chemical vapor deposition (HDPCVD) process, a spin-on process, a sputtering process, or another applicable process. The patterning process for forming the patterned photoresist layer may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

Moreover, the dielectric layer may be a buffer layer between the substrate 101 and the mask layer. In some embodiments, the dielectric layer is used as a stop layer when the mask layer is removed. The dielectric layer may be made of silicon oxide. The mask layer may be made of silicon oxide, silicon nitride, silicon oxynitride, or another applicable material. The dielectric layer and the mask layer may be formed by deposition processes, which may include a chemical vapor deposition (CVD) process, a high-density plasma chemical vapor deposition (HDPCVD) process, a spin-on process, a sputtering process, or another applicable process.

After the patterned photoresist layer is formed, the dielectric layer and the mask layer are patterned by using the patterned photoresist layer as a mask, in accordance with some embodiments. As a result, a patterned dielectric layer and a patterned mask layer are obtained. Afterwards, the patterned photoresist layer is removed. Next, an etching process is performed on the substrate 101 to form the fin structures 107a and 107b by using the patterned dielectric layer and the patterned mask layer as a mask. The etching process may be a dry etching process or a wet etching process.

In some embodiments, the substrate 101 is etched by a dry etching process. The dry etching process includes using a fluorine-based etchant gas, such as $SF_6$, $C_xF_y$, $NF_3$ or a combination thereof. The etching process may be a time-controlled process, and continue until the fin structures 107a and 107b reach a predetermined height. For example, the fin structures 107a and 107b have a fin height H1, and the fin height H1 is greater than about 80 nm. In some embodiments, each of the fin structures 107a and 107b has a width that gradually decreases from the bottom to the top.

After the fin structures 107a and 107b are formed, an insulating layer (not shown) is formed to cover the fin structures 107a and 107b, the patterned dielectric layer, and the patterned mask layer, in accordance with some embodiments. In some embodiments, the insulating layer is made of silicon oxide, silicon nitride, silicon oxynitride, fluoride-doped silicate glass (FSG), or another low-k dielectric material. The insulating layer may be deposited by a chemical vapor deposition (CVD) process, a spin-on-glass process, or another applicable process.

Next, the insulating layer is thinned or planarized to expose the top surface of the patterned mask layer. In some embodiments, the insulating layer is thinned by a chemical mechanical polishing (CMP) process. Afterwards, the patterned dielectric layer and the patterned mask layer are removed, an upper portion of the insulating layer is removed to form an isolation structure 109, as shown in FIG. 1A in accordance with some embodiments. The isolation structure 109 may be a shallow trench isolation (STI) structure surrounding the fin structures 107a and 107b. It should be noted that the fin structures 107a and 107b protrude from the isolation structure 109, in accordance with some embodiments.

Figure 1B:
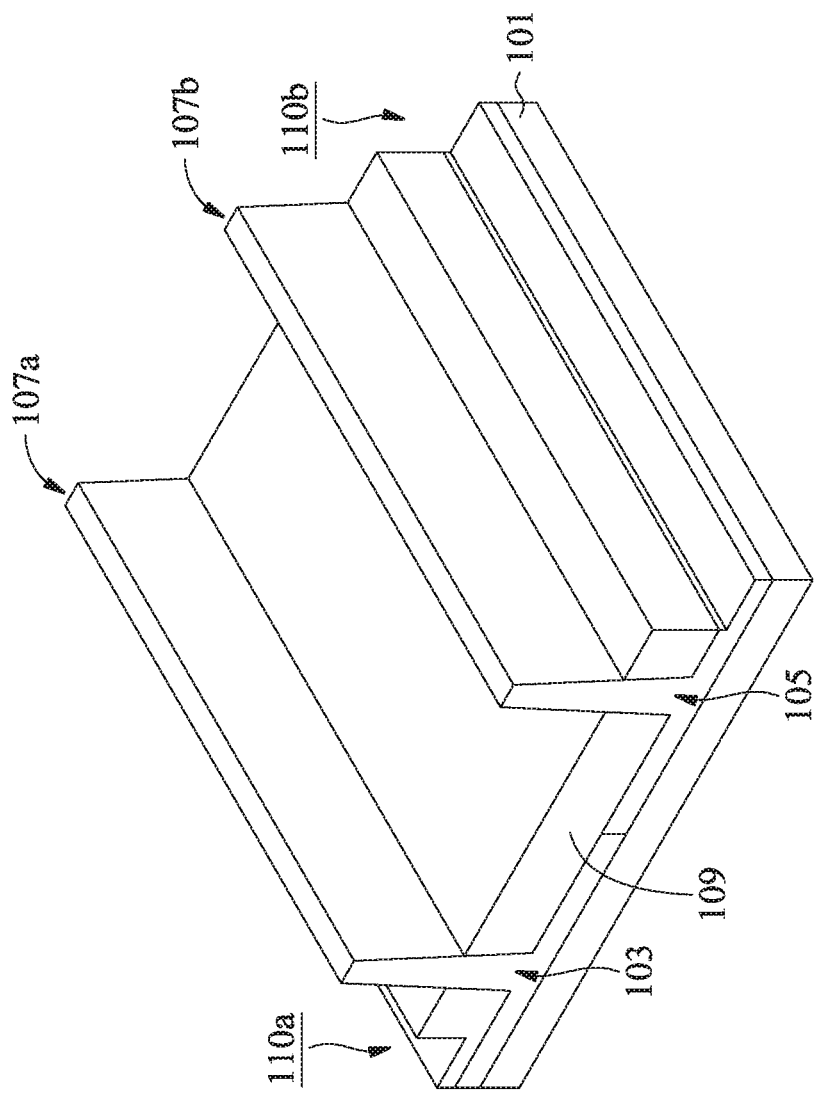

Afterwards, portions of the isolation structure 109 are removed to form a trench 110a over the N-type well region 103 and a trench 110b over the P-type well region 105, as shown in FIG. 1B in accordance with some embodiments. In some embodiments, the trench 110a and the trench 110b are substantially parallel to the longitudinal directions of the fin structures 107a and 107b. Moreover, in some embodiments, the fin structures 107a and 107b are between the trenches 110a and 110b.

It should be noted that the P-type well region 105 is exposed by the trench 110b, while the N-type well region 103 is covered by the remaining portion of the isolation structure 109 under the trench 110a, in accordance with some embodiments. In some other embodiments, the N-type well region 103 is exposed by the trench 110a, these embodiments will be described in detail later according to FIGS. 3A and 3B. In some embodiments, the trenches 110a and 110b are formed by etching process. For example, the trenches 110a and 110b, which have different depths, are formed by separate etching processes. The etching processes may include dry etching process, wet etching process, or a combination thereof. In addition, a portion of the P-type well region is removed during the etching process for forming the trench 110b, in accordance with some embodiments.

Figure 1C:
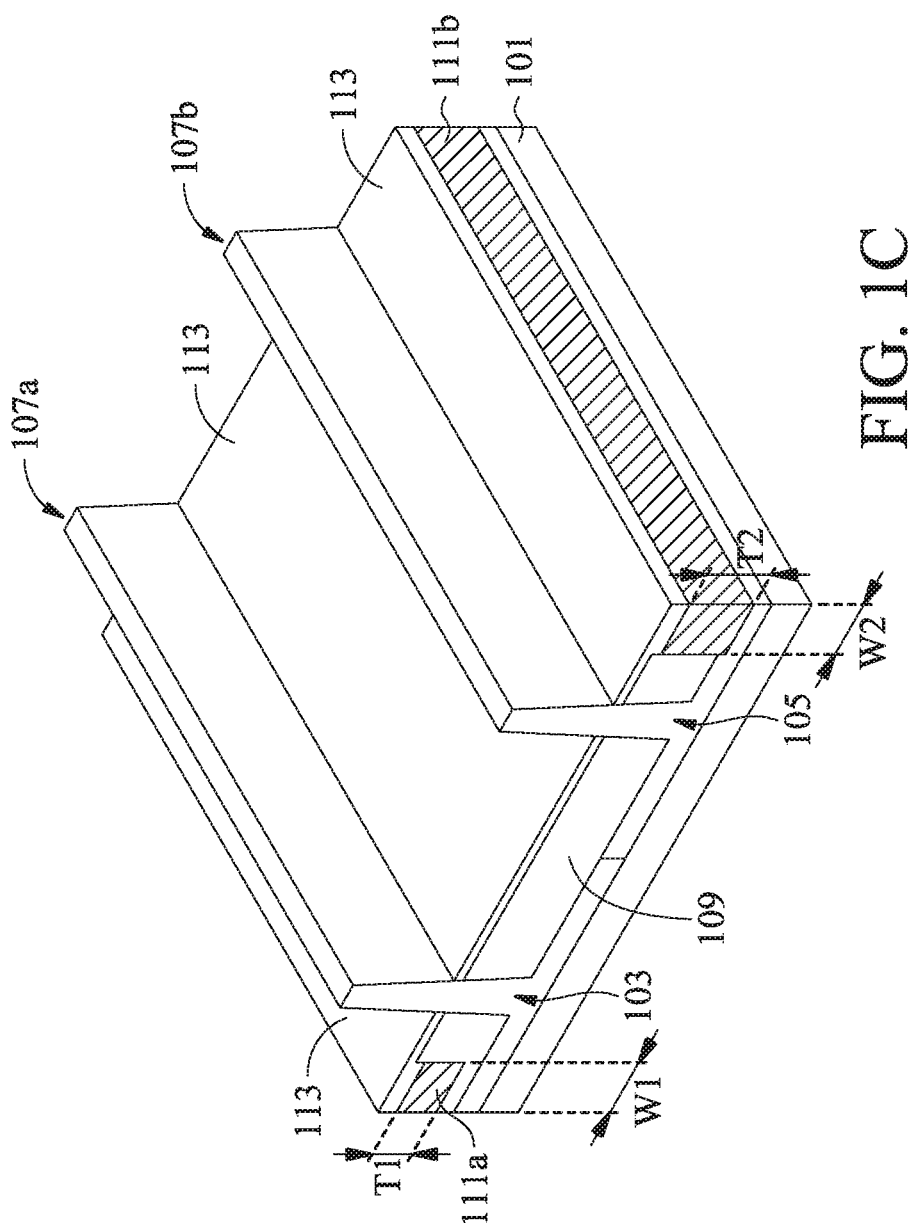

Next, a buried conductive line 111a is formed in the trench 110a, a buried conductive line 110b is formed in the trench 110b, and a dielectric capping layer 113 is formed covering the buried conductive lines 111a and 111b, as shown in FIG. 1C in accordance with some embodiments. In some embodiments, the buried conductive lines 110a and 110b are made of a conductive material such as titanium (Ti), titanium nitride (TiN), nickel (Ni), molybdenum (Mo), platinum (Pt), cobalt (Co), ruthenium (Ru), tungsten (W), tantalum nitride (TaN), copper (Cu), silicide, another applicable material, or a combination thereof.

In some embodiments, the buried conductive lines 111a and 111b are simultaneously formed by a deposition process, such as a chemical vapor deposition (CVD) process, a metal organic chemical vapor deposition (MOCVD) process, a physical vapor deposition (PVD) process, an atomic layer deposition (ALD) process, a plating process or another applicable process. In some other embodiments, the buried conductive lines 111a and 111b are independently formed by deposition processes.

After the deposition process, the buried conductive lines 111a and 111b may be selectively recessed (etched back) by an etching process. After the buried conductive lines 111a and 111b are formed, the top surfaces of the buried conductive lines 111a and 111b are substantially level with or lower than the top surface of the isolation structure 109, in accordance with some embodiments. In addition, each of the buried conductive lines 110a and 110b may include a single layer or multiple layers.

Moreover, in some embodiments, the buried conductive line 111a has a thickness T1, the buried conductive line 111b has a thickness T2, and the thickness T2 is greater than the thickness T1. In some embodiments, the thickness of each of the buried conductive lines 111a and 111b (e.g., the thickness T1 or the thickness T2) is in a range from about 20 nm to about 100 nm. If the thicknesses of the buried conductive lines 111a and 111b are too large (i.e., greater than about 100 nm), the buried conductive lines 111a and 111b may not be fully embedded in the isolation structure 109 and the substrate 101. If the thicknesses of the buried conductive lines 111a and 111b are too small (i.e., less than about 20 nm), the resistances of the buried conductive lines 111a and 111b may be too large. In some other embodiments, the thickness T2 is substantially the same as the thickness T1.

Furthermore, in some embodiments, the buried conductive line 111a has a width W1, the buried conductive line 111b has a width W2, and both of the width W1 and the width W2 are in a range from about 10 nm to about 100 nm. In some embodiments, since the buried conductive line 111b penetrates through the isolation structure 109 and further extends into the top portion of the P-type well region 105, the contact areas between the buried conductive line 111b and the P-type well region 105 may be increased, and the resistance may be decreased. However, in some embodiments, the buried conductive line 111b does not extend into the top portion of the P-type well region 105, and the interface between the buried conductive line 111b and the P-type well region 105 is substantially level with the interface between the isolation structure 109 and the P-type well region 105.

After the buried conductive lines 111a and 111b are formed, the dielectric capping layer 113 is formed covering the buried conductive lines 111a and 111b and the isolation structure 109, and the fin structures 107a and 107b protrude from the dielectric capping layer 113, in accordance with some embodiments. In some embodiments, the dielectric capping layer 113 is made of silicon oxide ($SiO_2$), silicon nitride (SiN), silicon carbide (SiC), silicon oxynitride (SiON), silicon carbon nitride (SiCN), silicon oxide carbonitride (SiOCN), another dielectric material, or a combination thereof.

In some embodiments, the dielectric capping layer 113 is conformally formed by a deposition process, such as chemical vapor deposition (CVD), physical vapor deposition (PVD), or a combination thereof, and a subsequent etching process, which removes portions of the dielectric capping layer over the sidewalls and the top surfaces of the fin structures 107a and 107b.

Figure 1D:
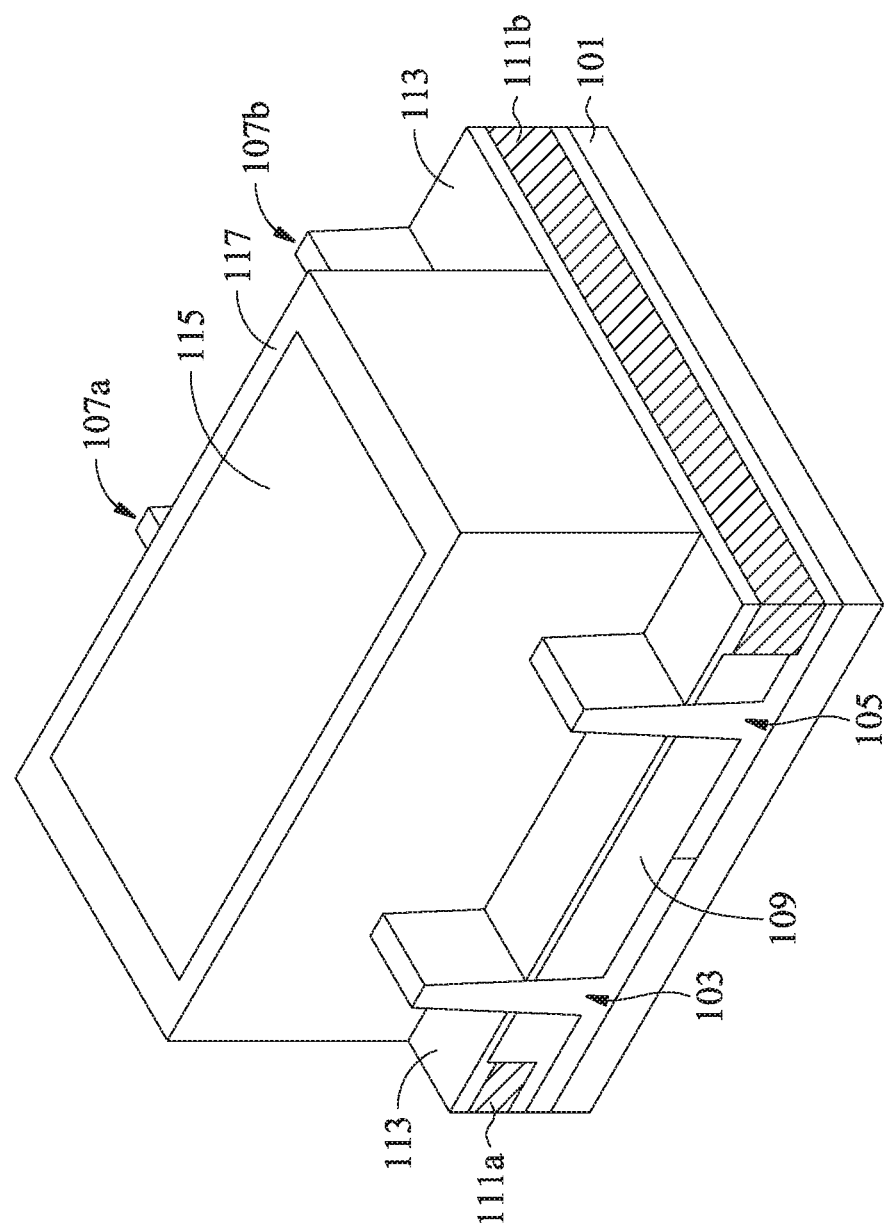

Afterwards, a dummy gate structure 115 is formed across the fin structures 107a and 107b and extends over the dielectric capping layer 113, and a gate spacer 117 is formed surrounding the dummy gate structure 115, as shown in FIG. 1D in accordance with some embodiments. To simplify the diagram, only one dummy gate structure 115 is depicted. The semiconductor structure 100a may include more dummy gate structures.

In some embodiments, the dummy gate structure 115 extends along a direction that is substantially perpendicular to the longitudinal directions of the fin structures 107a and 107b, and the gate spacer 117 at least partially overlaps the buried conductive lines 111a and 111b. In some embodiments, portions of the dummy gate structure 115 overlaps the buried conductive lines 111a and 111b.

In some embodiments, the dummy gate structure 115 includes a dummy gate dielectric layer (not shown) and a dummy gate electrode (not shown) over the dummy gate dielectric layer. In some embodiments, the dummy gate dielectric layer is made of silicon oxide, silicon nitride, silicon oxynitride, the high-k material, another suitable dielectric material, or a combination thereof.

In some embodiments, the high-k material may include, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k material may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, $(Ba,Sr)TiO_3$(BST), $Al_2O_3$, another suitable high-k dielectric material, or a combination thereof.

In some embodiments, the dummy gate electrode is made of polysilicon, a metal material, another suitable conductive material, or a combination thereof. In some embodiments, the metal material may include, but is not limited to, copper (Cu), aluminum (Al), tungsten (W), molybdenum (Mo), titanium (Ti), tantalum (Ta), platinum (Pt), or hafnium (Hf). In some embodiments, the dummy gate electrode will be replaced with another conductive material such as a metal material in subsequent processes.

Moreover, in order to improve the speed of the semiconductor structure 100a the gate spacer 117 may be made of low-k dielectric materials. In some embodiments, the low-k dielectric materials have a dielectric constant (k value) less than about 3.5. Examples of low-k dielectric materials include, but are not limited to, silicon oxide, silicon nitride, silicon oxynitride (SiON), silicon carbonitride (SiCN), silicon oxide carbonitride (SiOCN), fluorinated silica glass (FSG), carbon doped silicon oxide, amorphous fluorinated carbon, parylene, bis-benzocyclobutenes (BCB), or polyimide. In addition, the gate spacer 117 may be a single layer or multiple layers. After the gate spacer 117 is formed, portions of the fin structures 107a and 107b exposed by the dummy gate structure 115 and the gate spacer 117 are recessed to form recesses at two sides of each of the fin structures 107a and 107b, strained materials are grown in the recesses by epitaxial (epi) processes to form drain structure 119a, drain structure 119b, source structure 119c and source structure 119d in accordance with some embodiments. More specifically, the drain structure 119a and the source structure 119c are formed at two sides of the fin structure 107a, and the drain structure 119b and the source structure 119d are formed at two sides of the fin structure 107b, as shown in FIGS. 1E and 2B in accordance with some embodiments (FIG. 2B will be described in more details afterwards).

In some embodiments, the materials of the drain structure 119a and the source structure 119c, which are formed over the N-type well region 103, are selected from a group consisting of SiGe, SiGeC, Ge, Si, another applicable material, or a combination thereof, the materials of the drain structure 119b and the source structure 119d, which are formed over the P-type well region 105, are selected from a group consisting of SiP, SiC, SiPC, SiAs, Si, another applicable material, or a combination thereof, in accordance with some embodiments.

Figure 1E:
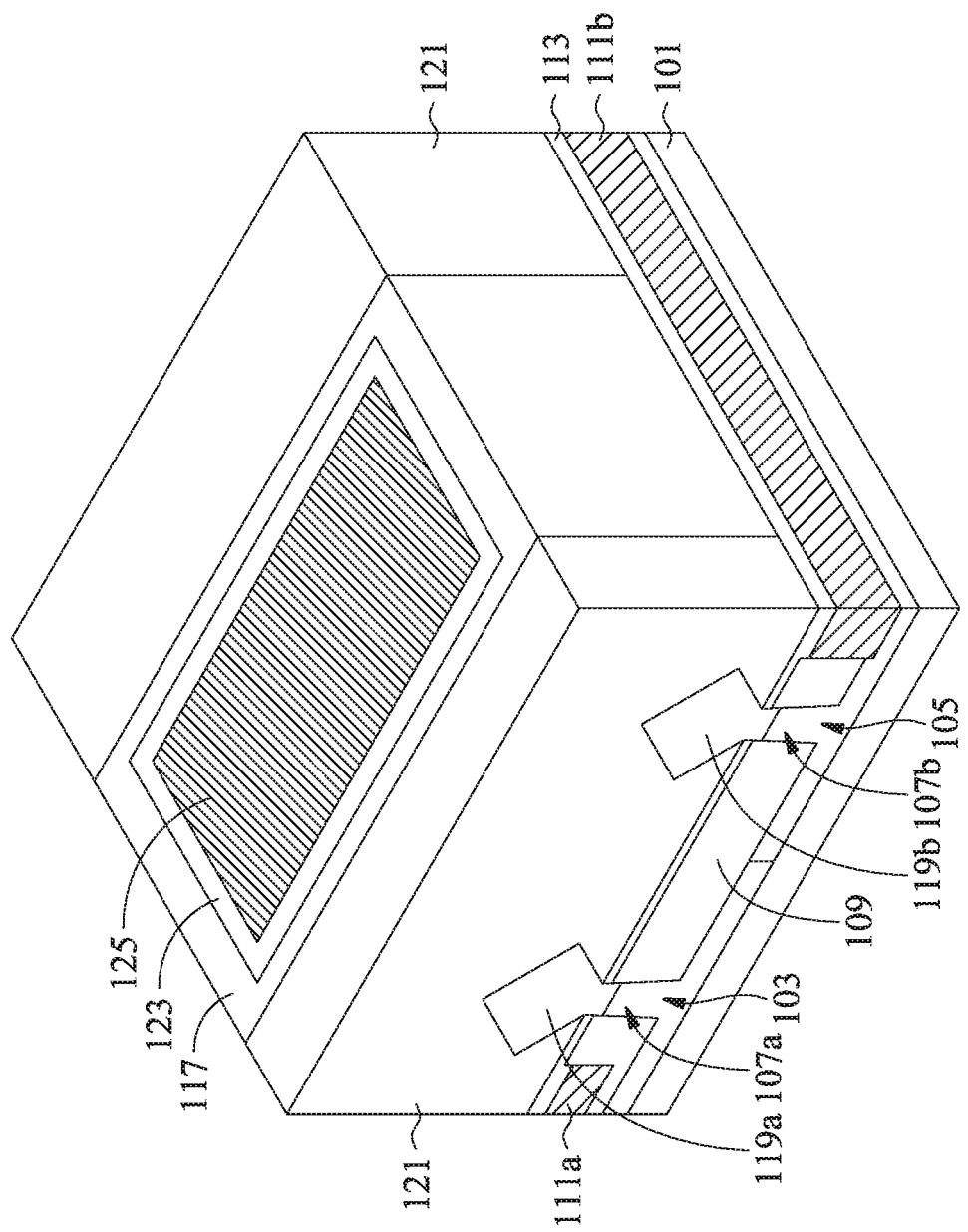

After the drain structures 119a, 119b and the source structures 119c, 119d are formed, an inter-layer dielectric (ILD) structure 121 is formed covering the drain structures 119a, 119b and the source structures 119c, 119d, as shown in FIG. 1E in accordance with some embodiments. In some embodiments, the ILD structure 121 includes multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials.

Examples of the low-k dielectric materials include, but are not limited to, fluorinated silica glass (FSG), carbon doped silicon oxide, amorphous fluorinated carbon, parylene, bis-benzocyclobutenes (BCB), or polyimide. In addition, the ILD structure 121 may be formed by chemical vapor deposition (CVD), physical vapor deposition, (PVD), atomic layer deposition (ALD), spin-on coating, or another applicable process.

Afterwards, a planarizing process is performed on the ILD structure 121 until the top surface of the dummy gate structure 115 (see FIG. 1D) is exposed. After the planarizing process, the top surfaces of the dummy gate structure 115 may be substantially level with the top surface of the gate spacer 117 and the top surface of the ILD structure 121. In some embodiments, the planarizing process includes a grinding process, a chemical mechanical polishing (CMP) process, an etching process, another applicable process, or a combination thereof.

Next, the dummy gate structure 115 is replaced with a gate structure including a gate dielectric layer 123 and a gate electrode 125 over the gate dielectric layer 123, as shown in FIG. 1E in accordance with some embodiments. In some embodiments, the dummy gate structure 115 is removed to form an opening exposing the portions of the fin structures 107a and 107b surrounded by the gate spacer 117, and the dummy gate structure 115 is removed by an etching process, such as a dry etching process or a wet etching process. Then, the gate structure including the gate dielectric layer 123 and the gate electrode 125 are filled in the opening, and sidewalls of the gate electrode 125 may be covered by the gate dielectric layer 123, in accordance with some embodiments. In addition, a work function layer (not shown) may be formed between the gate dielectric layer 123 and the gate electrode 125.

The gate dielectric layer 123 may include a single layer or multiple layers. In some embodiments, the gate dielectric layer 123 are made of silicon oxide, silicon nitride, silicon oxynitride (SiON), dielectric material(s) with high dielectric constant (high-k), or a combination thereof. In some embodiments, the gate dielectric layer 123 is deposited by a plasma enhanced chemical vapor deposition (PECVD) process or a spin coating process.

Moreover, the gate electrode 125 is made of a conductive material such as aluminum (Al), copper (Cu), tungsten (W), titanium (Ti), tantalum (Ta), or another applicable material, in accordance with some embodiments. In some other embodiments, the gate electrode 125 includes TiN, TiAl, TiAlN, TaN, TaAl, TaAlN, TaAlC, TaCN, W, or a combination thereof. The gate electrode layer 125 may be formed by a deposition process, such as a chemical vapor deposition (CVD) process, a physical vapor deposition (PVD) process, an atomic layer deposition (ALD) process, a high density plasma chemical vapor deposition (HDPCVD) process, a metal organic chemical vapor deposition (MOCVD) process, or a plasma enhanced chemical vapor deposition (PECVD) process.

Figure 1F:
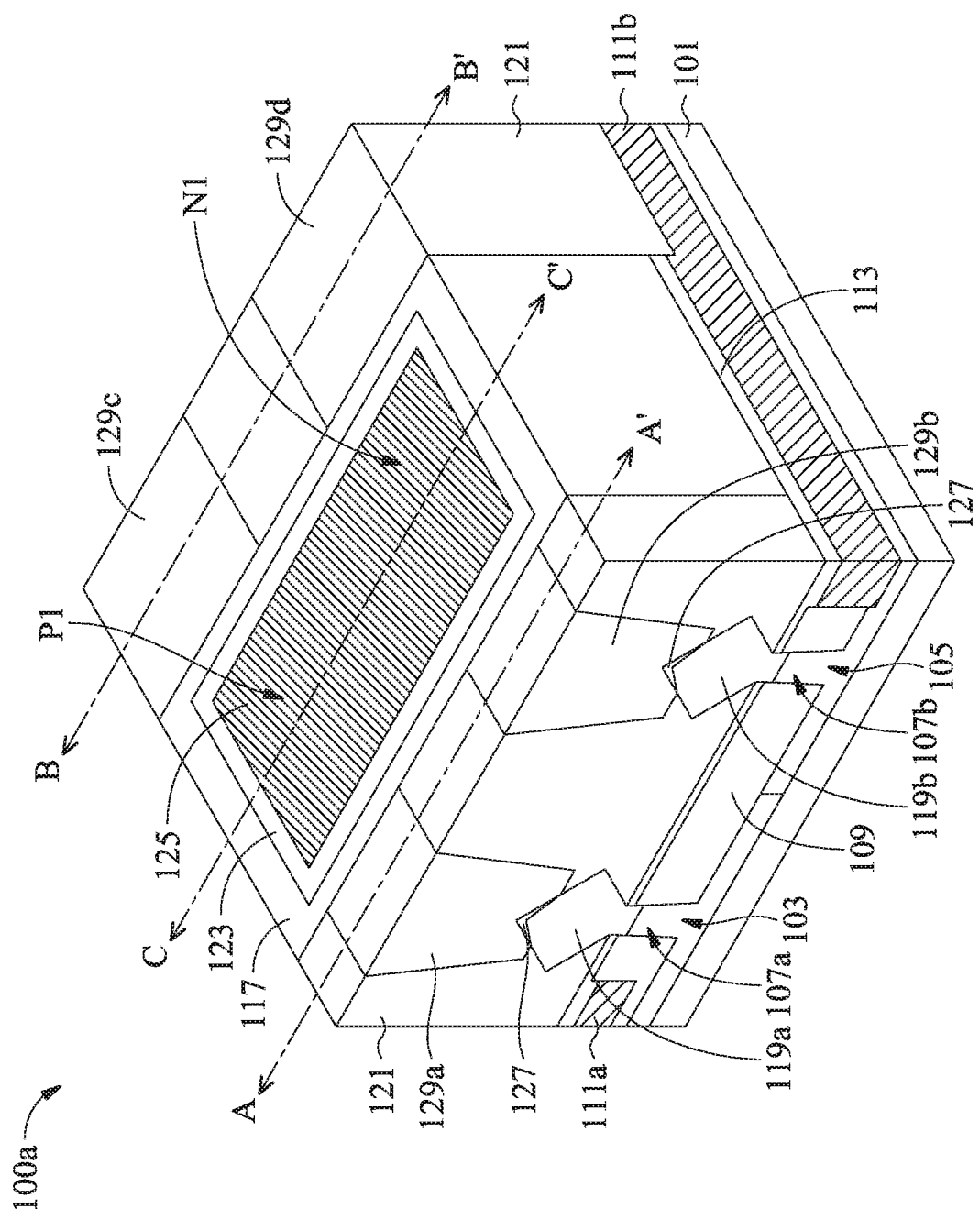

Next, portions of the ILD structure 121 are removed to form contact openings exposing the drain structures 119a, 119b and the source structures 119c, 119d, and contacts 129a, 129b, 129c and 129d are formed in the contact openings, as shown in FIG. 1F, in accordance with some embodiments. More specifically, the ILD structure 121 is partially removed by an etching process, such as a dry etching process. Afterwards, a silicide layer 127 is formed over each of the drain structures 119a, 119b and the source structures 119c, 119d, and the contacts 129a, 129b, 129c and 129d are formed over the silicide layer 127, as shown in FIG. 1F in accordance with some embodiments.

In some embodiments, the contacts 129a to 129d include aluminum (Al), copper (Cu), tungsten (W), titanium (Ti), nickel (Ni), molybdenum (Mo), platinum (Pt), cobalt (Co), ruthenium (Ru), tantalum (Ta), titanium nitride (TiN), tantalum nitride (TaN), nickel silicide (NiSi), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof. In some embodiments, the contacts 129a to 129d include a titanium nitride layer and tungsten formed over the titanium nitride layer.

In some embodiments, the contact 129a is electrically connected to the drain structure 119a, the contact 129b is electrically connected to the drain structure 119b, the contact 129c is electrically connected to the source structure 119c, and the contact 129d is electrically connected to the source structure 119d. After the contacts 129a to 129d are formed, the semiconductor structure 100a is obtained. The semiconductor structure 100a has a PMOS transistor P1 over the N-type well region 103, and an NMOS transistor N1 over the P-type well region 105, as shown in FIG. 1F in accordance with some embodiments. Moreover, the PMOS transistor P1 and the NMOS transistor N1 may be fin field effect transistors (FinFETs).

Figure 2A:
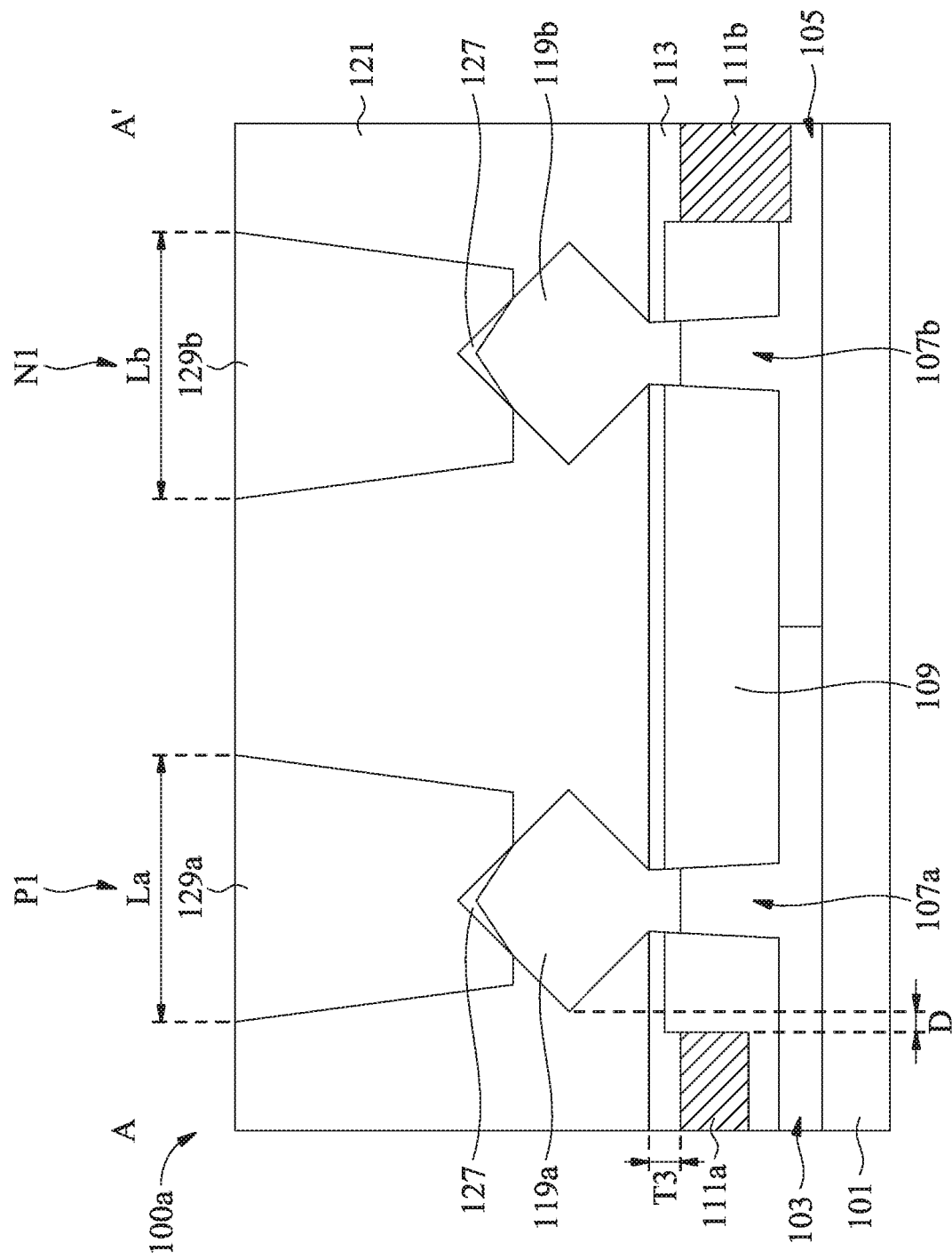
FIG. 2A illustrates a cross-sectional view of the semiconductor structure along line A-A' of FIG. 1F, in accordance with some embodiments of the disclosure.
Figure 2B:
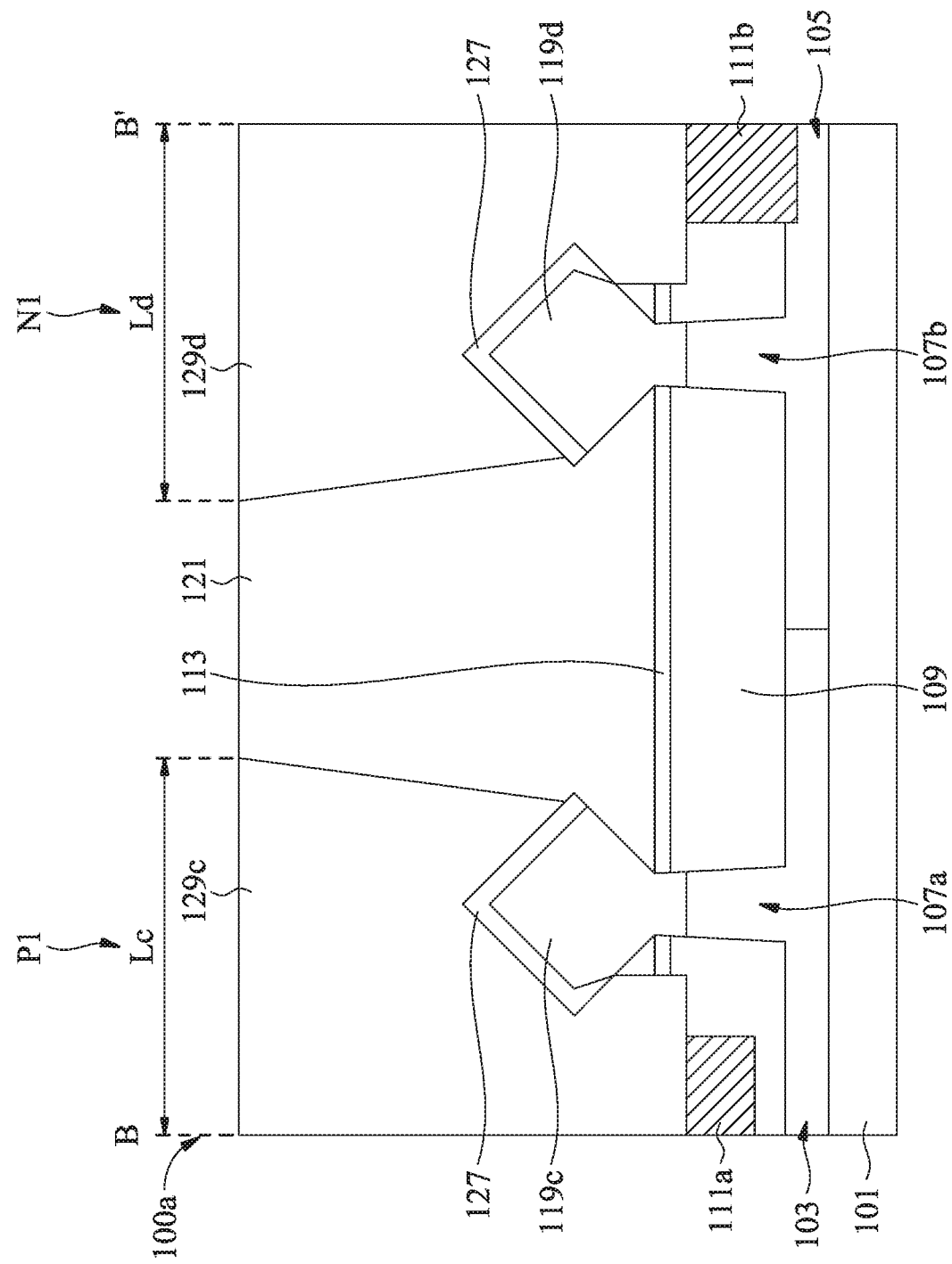
FIG. 2B illustrates a cross-sectional view of the semiconductor structure along line B-B' of FIG. 1F, in accordance with some embodiments of the disclosure.
Figure 2C:
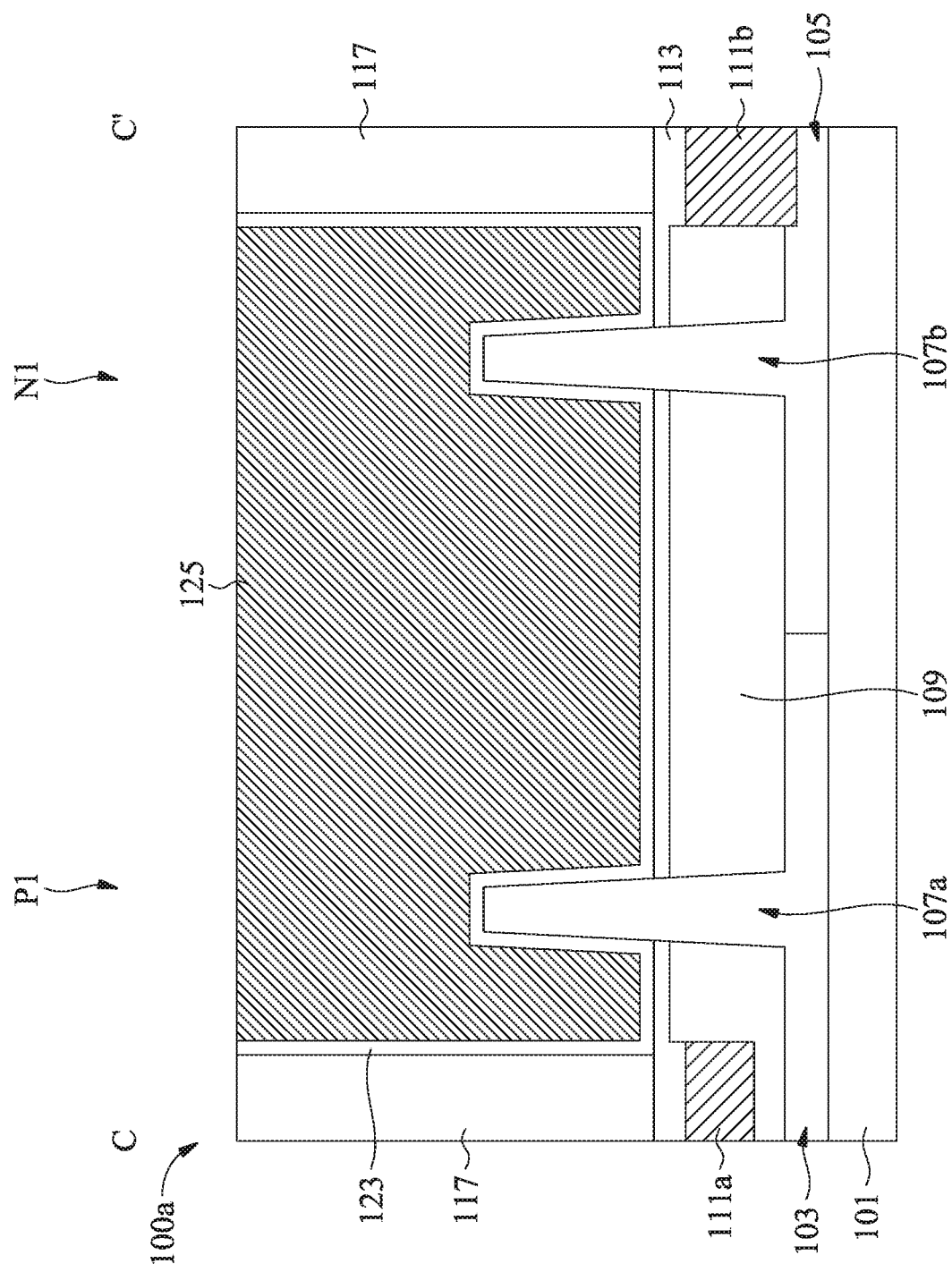
FIG. 2C illustrates a cross-sectional view of the semiconductor structure along line C-C' of FIG. 1F, in accordance with some embodiments of the disclosure.

FIG. 2A illustrates a cross-sectional view of the semiconductor structure 100a along line A-A' of FIG. 1F, FIG. 2B illustrates a cross-sectional view of the semiconductor structure 100a along line B-B' of FIG. 1F, and FIG. 2C illustrates a cross-sectional view of the semiconductor structure 100a along line C-C' of FIG. 1F, in accordance with some embodiments of the disclosure.

The contact 129a has a length La, the contact 129b has a length Lb, the contact 129c has a length Lc, and the contact 129d has a length Ld, as shown in FIGS. 2A and 2B in accordance with some embodiments. In some embodiments, the contacts 129c and 129d are longer contacts, and the contacts 129a and 129b are shorter contacts. Specifically, in some embodiments, the length Lc is greater than the length La, and the length Ld is greater than the length Lb. More specifically, in some embodiments, the contact 129c covers the source structure 119c and extends over the buried conductive line 111a, and the contact 129d covers the source structure 119d and extends over the buried conductive line 111b.

In addition, the length Lc of the contact 129c is along a direction of the longitudinal direction of the gate structure (i.e., the longitudinal direction of the gate electrode 125), and the contact 129c has a width along a direction of the longitudinal direction of the fin structure 107a. In some embodiments, the ratio of the length Lc to the width of the contact 129c is greater than about 1.5. Moreover, the length Ld of the contact 129d is along a direction of the longitudinal direction of the gate structure (i.e., the longitudinal direction of the gate electrode 125), and the contact 129d has a width along a direction of the longitudinal direction of the fin structure 107b. In some embodiments, the ratio of the length Ld to the width of the contact 129d is greater than about 1.5.

In some embodiments, the dielectric capping layer 113 has a thickness T3 (see FIG. 2A), the thickness T3 is in a range from about 5 nm to about 50 nm. It should be noted that the buried conductive lines 111a and 111b are separated from the drain structures 119a, 119b and the source structures 119c, 119d by the dielectric capping layer 113 and the ILD structure 121. In some embodiments, the shortest distance D (see FIG. 2A) between the buried conductive line 111a and the drain structure 119a is in a range from about 5 nm to about 50 nm. The shortest distance between the buried conductive line 111b and the drain structure 119b, the shortest distance between the buried conductive line 111a and the source structure 119c, and the shortest distance between the buried conductive line 111b and the source structure 119d are similar to the shortest distance D, which is also in a range from about 5 nm to about 50 nm.

In some embodiments, the gate spacer 117 overlaps the buried conductive lines 111a and 111b, and a portion of the gate dielectric layer 123 overlaps the buried conductive lines 111a and 111b, as shown in FIG. 2C in accordance with some embodiments. It should be noted that the buried conductive lines 111a and 111b are separated from the gate electrode 125 by the dielectric capping layer 113 and the gate dielectric layer 123, in accordance with some embodiments.

In some embodiments, the buried conductive line 111a is a VDD line (i.e., the supply voltage line), and the buried conductive line 111b is a VSS line (i.e., the electrical ground line). It should be noted that the source structure 119c of the PMOS transistor P1 and the buried conductive line 111a are electrically connected by the contact 129c, and the source structure 119d of the NMOS transistor N1 and the buried conductive line 111b are electrically connected by the contact 129d, in accordance with some embodiments.

By disposing the buried conductive line 111a in the isolation structure 109 to electrically connect the source structure 119c of the PMOS transistor P1, and disposing the buried conductive line 111b in the isolation structure 109 to electrically connect the source structure 119d of the NMOS transistor N1, the metal-layer level M1 area (the closest metal-layer level over the contacts 129a to 129d) may be saved, such that the routing flexibility of the metal-layer level M1 may be improved.

Moreover, the lower well pickup resistance may be obtained by disposing the buried conductive line 111b connected to the P-type well region 105, thus obtaining better latch up immunity as well as saving well strap area. As a result, routing efficiency and logic circuit density improvement are increased for the standard cells.

Figure 3A:
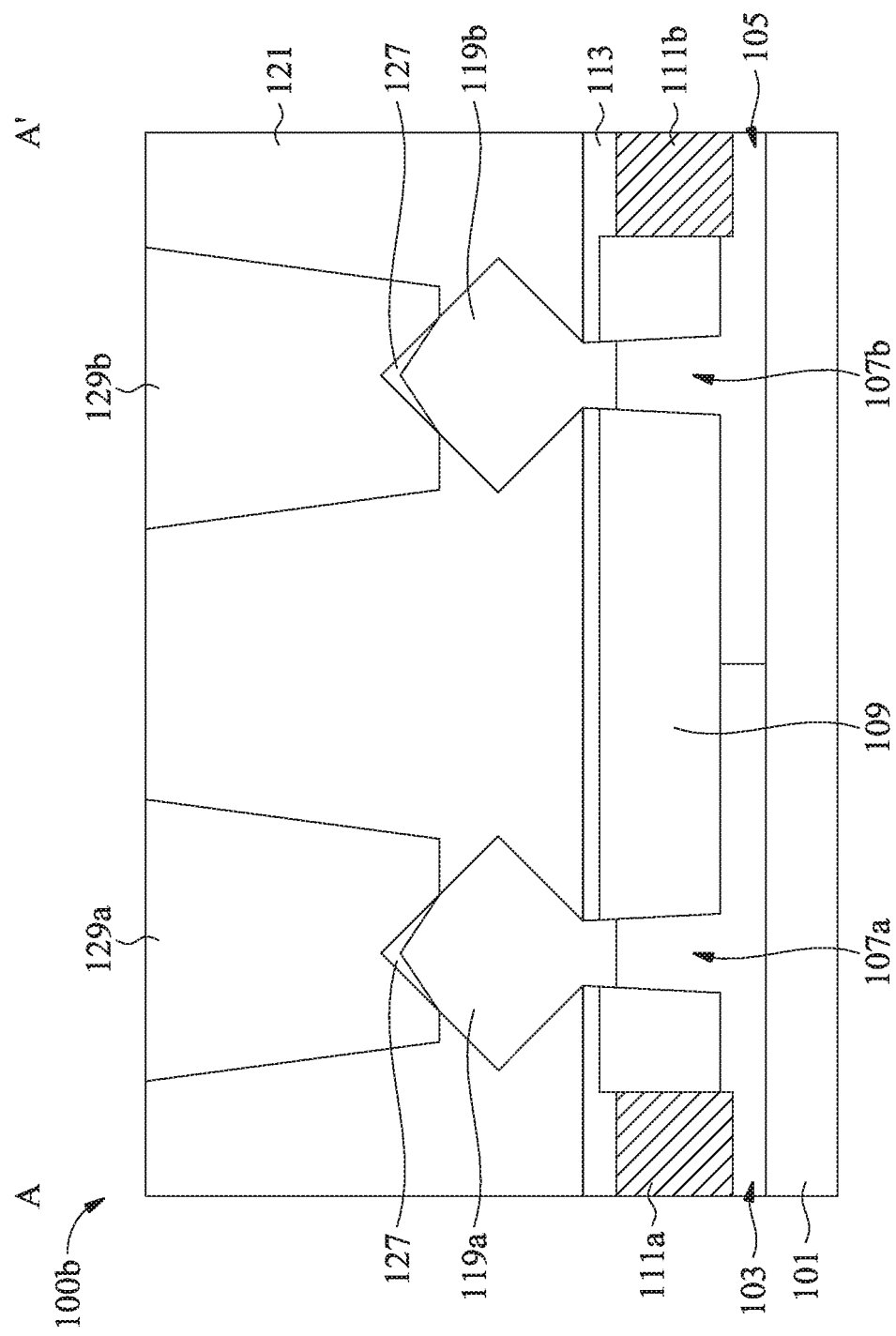
FIGS. 3A and 3B illustrate cross-sectional views of a semiconductor structure, in accordance with some embodiments of the disclosure.
Figure 3B:
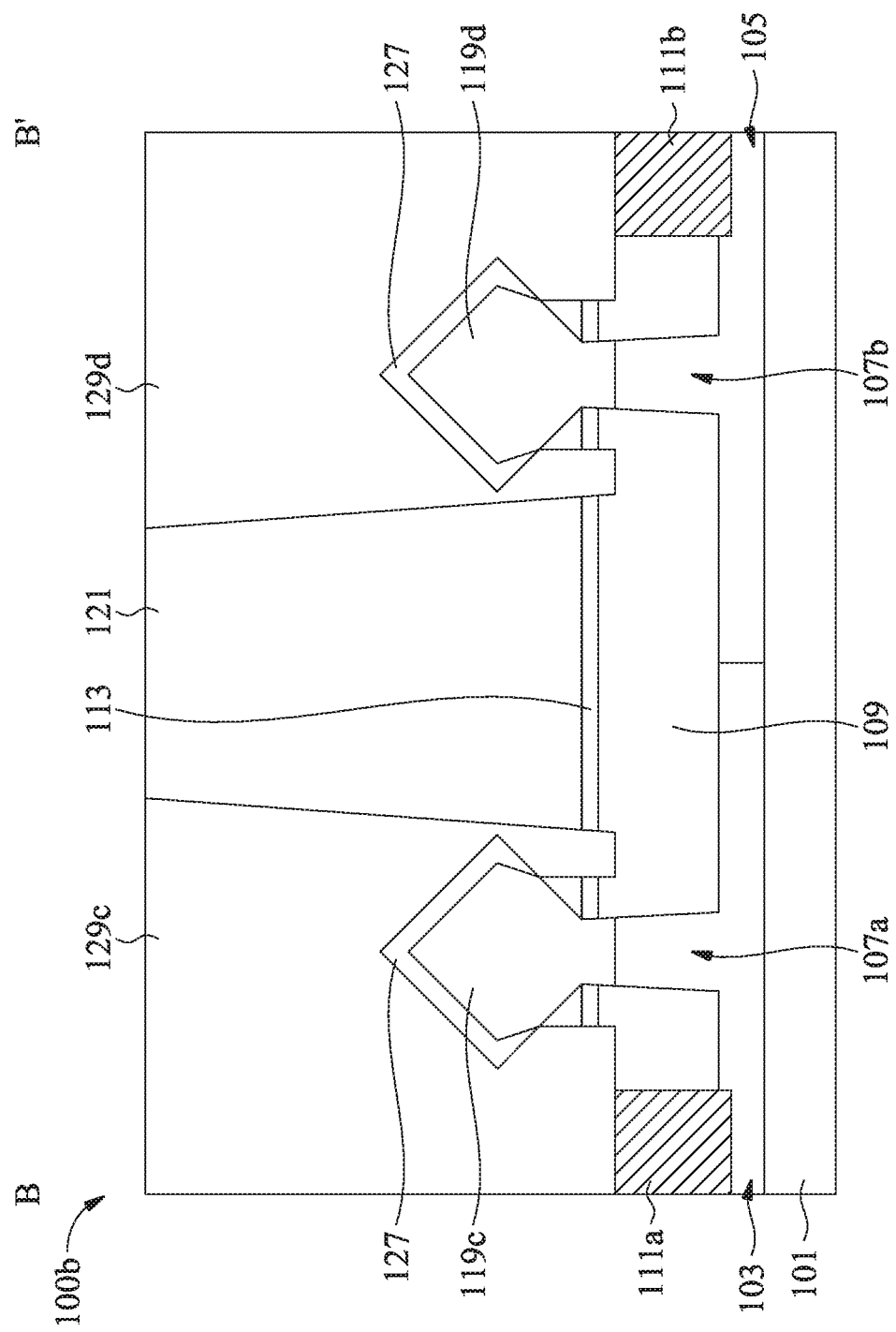

FIGS. 3A and 3B illustrate cross-sectional views of a semiconductor structure 100b, in accordance with some embodiments of the disclosure. The details of the semiconductor structure 100b may be similar to the semiconductor 100a, and are not repeated herein for simplicity. FIG. 3A illustrates a cross-sectional view of the semiconductor structure 100b along line A-A' of FIG. 1F, FIG. 2B illustrates a cross-sectional view of the semiconductor structure 100b along line B-B' of FIG. 1F, in accordance with some embodiments of the disclosure.

Similar to the buried conductive line 111b, the bottom surface of the buried conductive line 111a is lower than the bottom surface of the isolation structure 109, such that the buried conductive line 111a is connected to the N-type well region 103, as shown in FIGS. 3A and 3B in accordance with some embodiments. In some other embodiments, the bottom surfaces of the buried conductive lines 111a and 111b are level with the bottom surface of the isolation structure 109. In addition, the contact areas between the source structure (i.e., the source structure 119c or 119d) and the contact over the source structure (i.e., the contact 129c or 129d) are increased, as shown in FIG. 3B in accordance with some embodiments.

Figure 4:
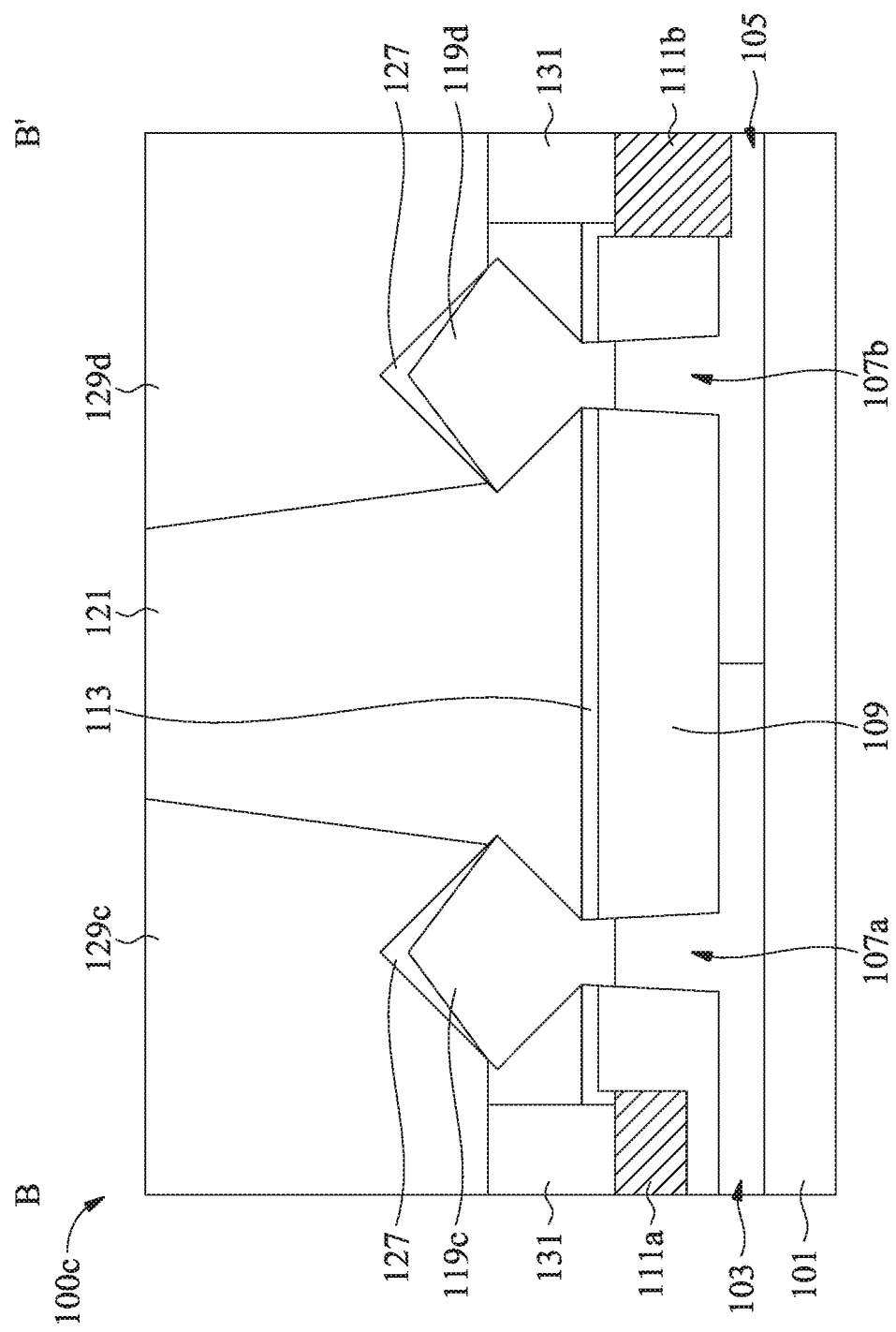
FIG. 4 illustrates a cross-sectional view of a semiconductor structure, in accordance with some embodiments of the disclosure.

FIG. 4 illustrates a cross-sectional view of a semiconductor structure 100c, in accordance with some embodiments of the disclosure. The details of the semiconductor structure 100c may be similar to the semiconductor 100a, and are not repeated herein for simplicity. FIG. 4 illustrates a cross-sectional view of the semiconductor structure 100c along line B-B' of FIG. 1F, in accordance with some embodiments of the disclosure.

The longer contacts (i.e., the contacts 129c and 129d) over the source structures 119c and 119d are not in direct contact with the buried conductive lines 111a and 111b, as shown in FIG. 4 in accordance with some embodiments. In some embodiments, vias 131 are formed between the contacts 129c, 129d and the buried conductive lines 111a, 111b, the contact 129c is electrically connected to the buried conductive line 111a through one of the vias 131, and the contact 129d is electrically connected to the buried conductive line 111b through the other via 131.

In some embodiments, the vias 131 are made of a conductive material such as titanium (Ti), titanium nitride (TiN), nickel (Ni), molybdenum (Mo), platinum (Pt), cobalt (Co), ruthenium (Ru), tungsten (W), tantalum nitride (TaN), copper (Cu), silicide, another applicable material, or a combination thereof. Moreover, the vias 131 may be formed by a photolithography process and an etching process.

Figure 5:
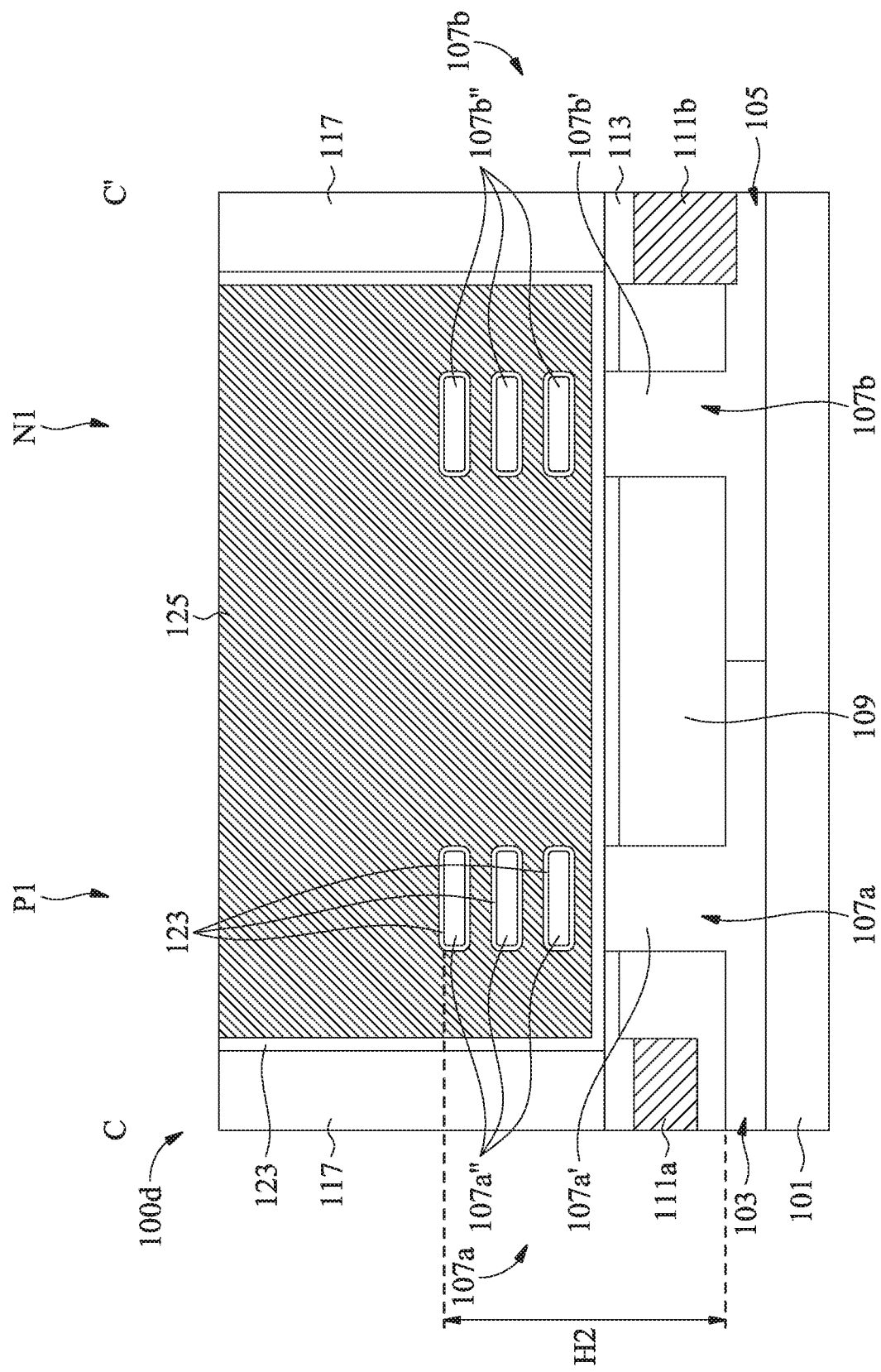
FIG. 5 illustrates a cross-sectional view of a semiconductor structure, in accordance with some embodiments of the disclosure.

FIG. 5 illustrates a cross-sectional view of a semiconductor structure 100d, in accordance with some embodiments of the disclosure. The details of the semiconductor structure 100d may be similar to the semiconductor 100a, and are not repeated herein for simplicity. FIG. 5 illustrates a cross-sectional view of the semiconductor structure 100d along line C-C' of FIG. 1F, in accordance with some embodiments of the disclosure.

In some embodiments, the fin structure 107a includes a base portion 107a' and a plurality of nanowires 107a" over the base portion 107a', and the fin structure 107b includes a base portion 107b' and a plurality of nanowires 107b" over the base portion 107b'. In some embodiments, each of the nanowires 107a" and 107b" is surrounded by the gate structure including the gate dielectric layer 123 and the gate electrode 125, and the nanowires 107a" and 107b" are channels of the semiconductor structure 100d. The PMOS transistor P1 and the NMOS transistor N1 are gate-all-around (GAA) transistors, as shown in FIG. 5 in accordance with some embodiments.

It should be noted that although three nanowires 107a" of the fin structure 107a and three nanowires 107b" of the fin structure 107b are illustrated in FIG. 5, the number of nanowires 107a" may be in a range from 2 to 10, and similarly, the number of nanowires 107b" may be in a range from 2 to 10. In some embodiments, the fin structures 107a and 107b have a fin height H2 defined by a distance between the top surface of the topmost nanowires 107a" and 107b" and the bottom surface of the isolation structure 109, and the fin height H2 is greater than about 80 nm.

Figure 6:
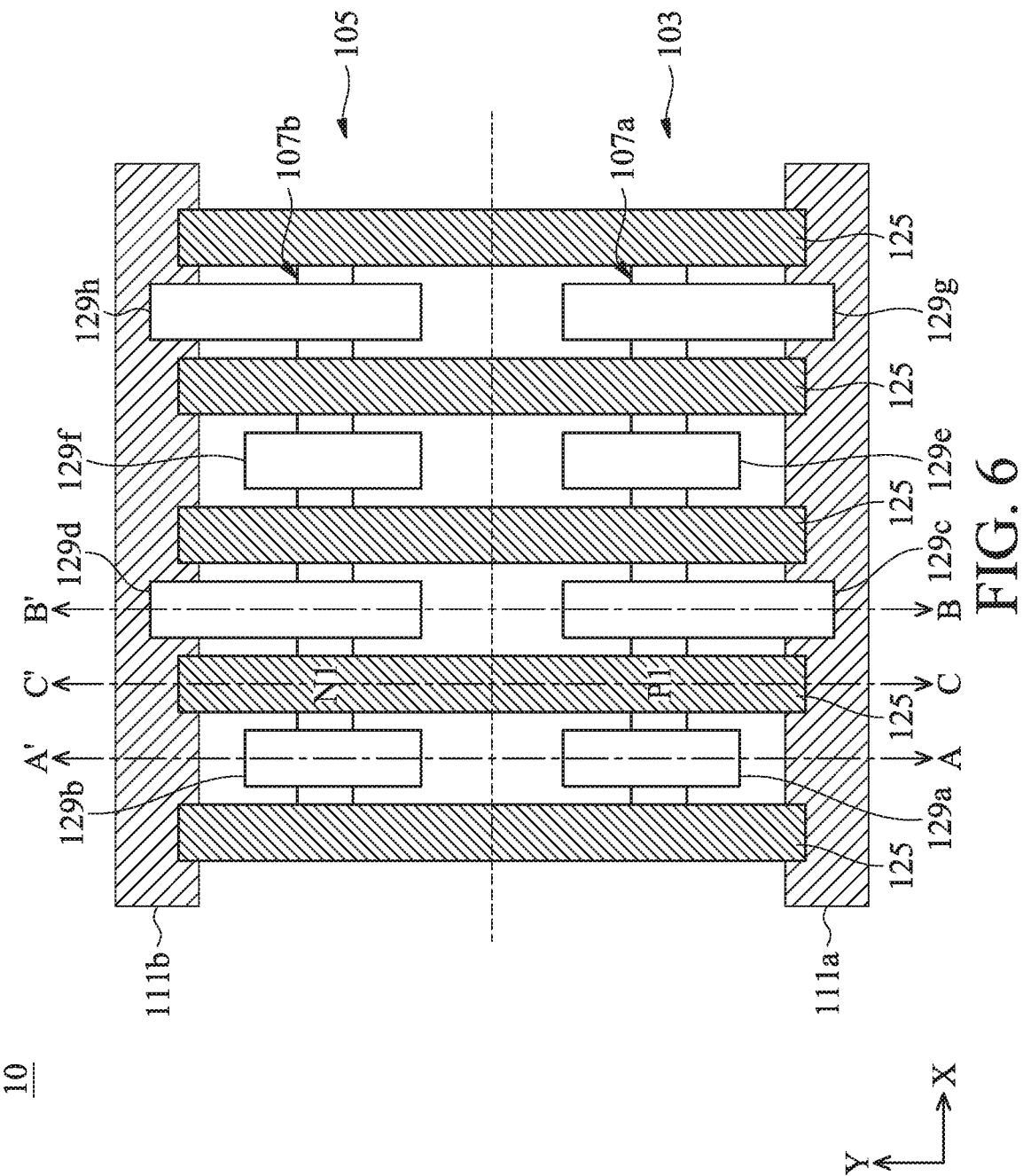
FIG. 6 illustrates a layout of features in a cell array, in accordance with some embodiments of the disclosure.

FIG. 6 illustrates a layout of features in a cell array 10, in accordance with some embodiments of the disclosure. In some embodiments, FIG. 2A is a cross-sectional view along line A-A' of FIG. 6, FIG. 2B is a cross-sectional view along line B-B' of FIG. 6, and FIG. 2C is a cross-sectional view along line C-C' of FIG. 6.

In FIG. 6, the fin structure 107a extending in the X-direction is disposed over the N-type well region 103, and the fin structure 107b extending in the X-direction is disposed over the P-type well region 105. The buried conductive line 111a is disposed over the N-type well region 103, the buried conductive line 111b is disposed over the P-type well region 105, and both of the buried conductive lines 111a and 111b are located on cell boundaries, such that the buried conductive lines 111a and 111b may be shared with adjacent cells arranged along the Y-direction.

Still referring to FIG. 6, the gate structures (only gate electrodes 125 of the gate structures are shown in FIG. 6 to simplify the diagram) extending in the Y-direction is disposed across the N-type well region 103 and the P-type well region 105. In some embodiments, the gate electrodes 125 partially overlap the buried conductive lines 111a and 111b. In some other embodiments, the gate electrodes 125 do not overlap the buried conductive lines 111a and 111b. Contacts 129a, 129b, 129c, 129d, 129e, 129f, 129g and 129h extending in the Y-direction are disposed between adjacent gate electrodes 125. In some embodiments, the contacts 129a, 129b, 129e and 129f are shorter contacts, which are electrically connected to the drain structures of the transistors in the cell array 10, and the contacts 129c, 129d, 129g and 129h are longer contacts, which are electrically connected to the source structures of the transistors in the cell array 10.

Figure 7A:
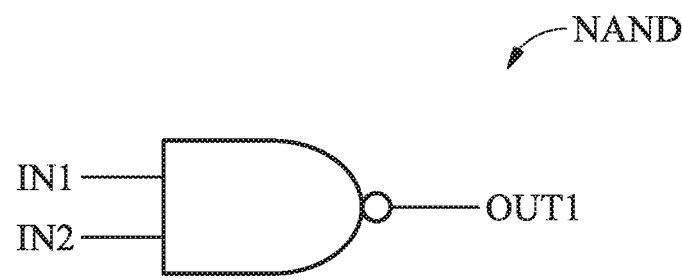
FIG. 7A illustrates the logic symbol of the standard cell NAND.
Figure 7B:
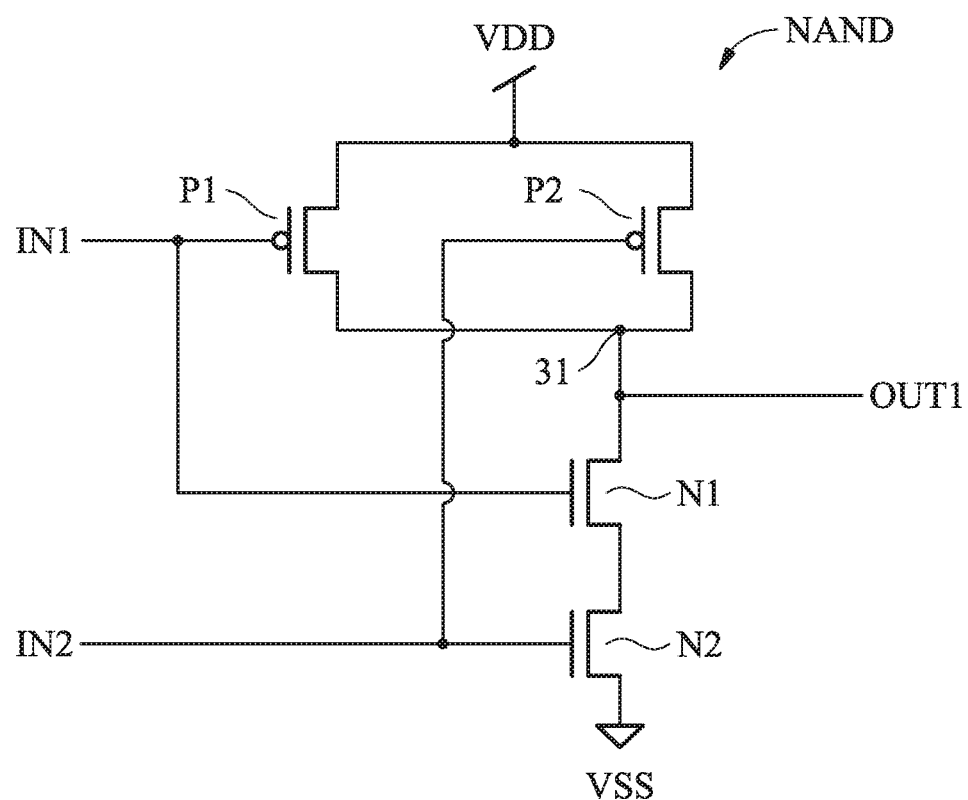
FIG. 7B is a circuit diagram of the standard cell NAND in FIG. 7A.

FIG. 7A illustrates the logic symbol of the standard cell NAND. FIG. 7B is a circuit diagram of the standard cell NAND in FIG. 7A. The standard cell NAND is a logic gate configured to provide an output signal OUT1 according two input signals IN1 and IN2. The standard cell NAND includes two PMOS transistors P1 and P2 and two NMOS transistors N1 and N2. In some embodiments, the two PMOS transistors P1 and P2 and two NMOS transistors N1 and N2 may be FinFETs with single fin or multiple-fin.

In the standard cell NAND, the PMOS transistors P1 and P2 are coupled in parallel between a node 31 and a power supply VDD. The NMOS transistor N1 is coupled between the node 31 and the NMOS transistor N2, and the NMOS transistor N2 is coupled between the NMOS transistor N1 and a ground VSS. The input signal IN1 is input to the gates of the PMOS transistor P1 and the NMOS transistor N1, and the input signal IN2 is input to the gates of the PMOS transistor P2 and the NMOS transistor N2. Furthermore, the output signal OUT1 is provided at the node 31.

Figure 8A:
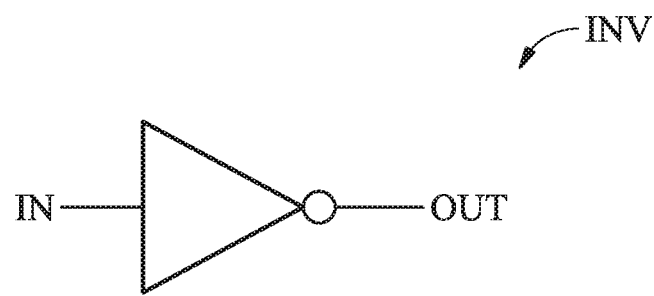
FIG. 8A illustrates the logic symbol of the standard cell INV (i.e., inverter).
Figure 8B:
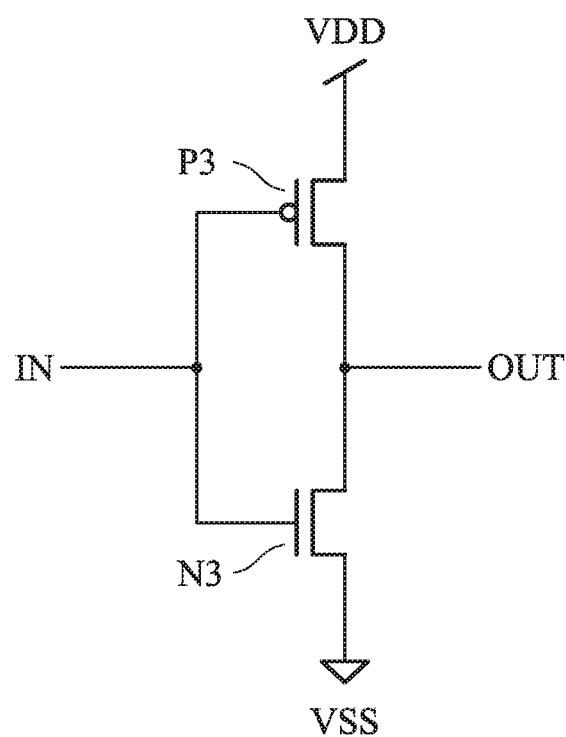
FIG. 8B is a circuit diagram of the standard cell INV in FIG. 8A.

FIG. 8A illustrates the logic symbol of the standard cell INV (i.e., inverter). FIG. 8B is a circuit diagram of the standard cell INV in FIG. 8A. The standard cell INV is a logic gate configured to inverting an input signal IN to provide an output signal OUT. The standard cell INV includes a PMOS transistor P3 and an NMOS transistor N3. In some embodiments, the PMOS transistor P3 and the NMOS transistors N3 may be FinFETs with single fin or multiple-fin.

In the standard cell INV, the PMOS transistor P3 is coupled between the NMOS transistor N3 and a power supply VDD. The NMOS transistor N3 is coupled between the PMOS transistor P3 and a ground VSS. The input signal IN is input to the gates of the PMOS transistor P3 and the NMOS transistor N3. Furthermore, the output signal OUT is provided at the drains of the NMOS transistor N3 and the PMOS transistor P3.

Figure 9A:
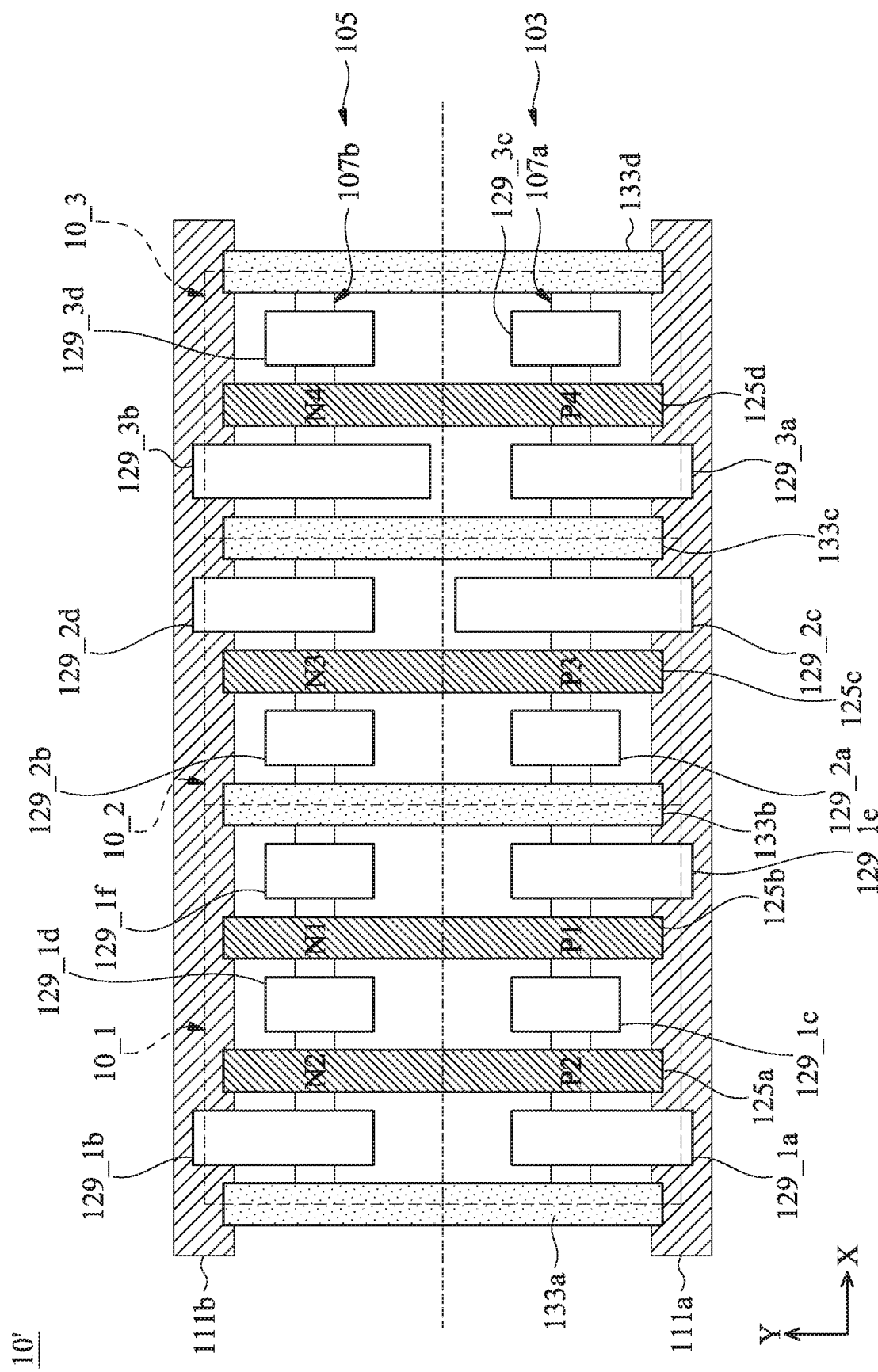
FIGS. 9A to 9C illustrate a layout of features of logic cells in a cell array, in accordance with some embodiments of the disclosure.
Figure 9B:
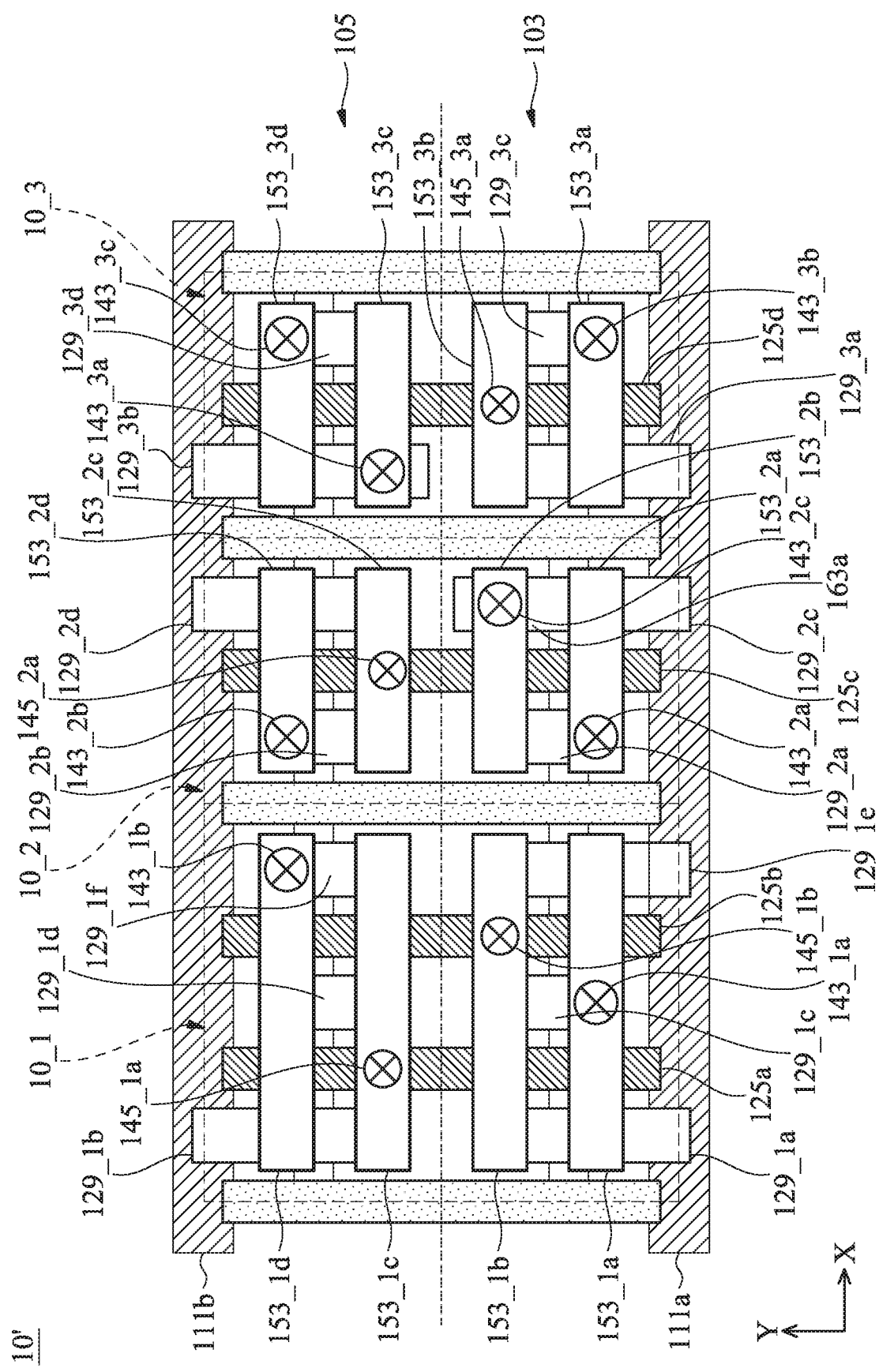
Figure 9C:
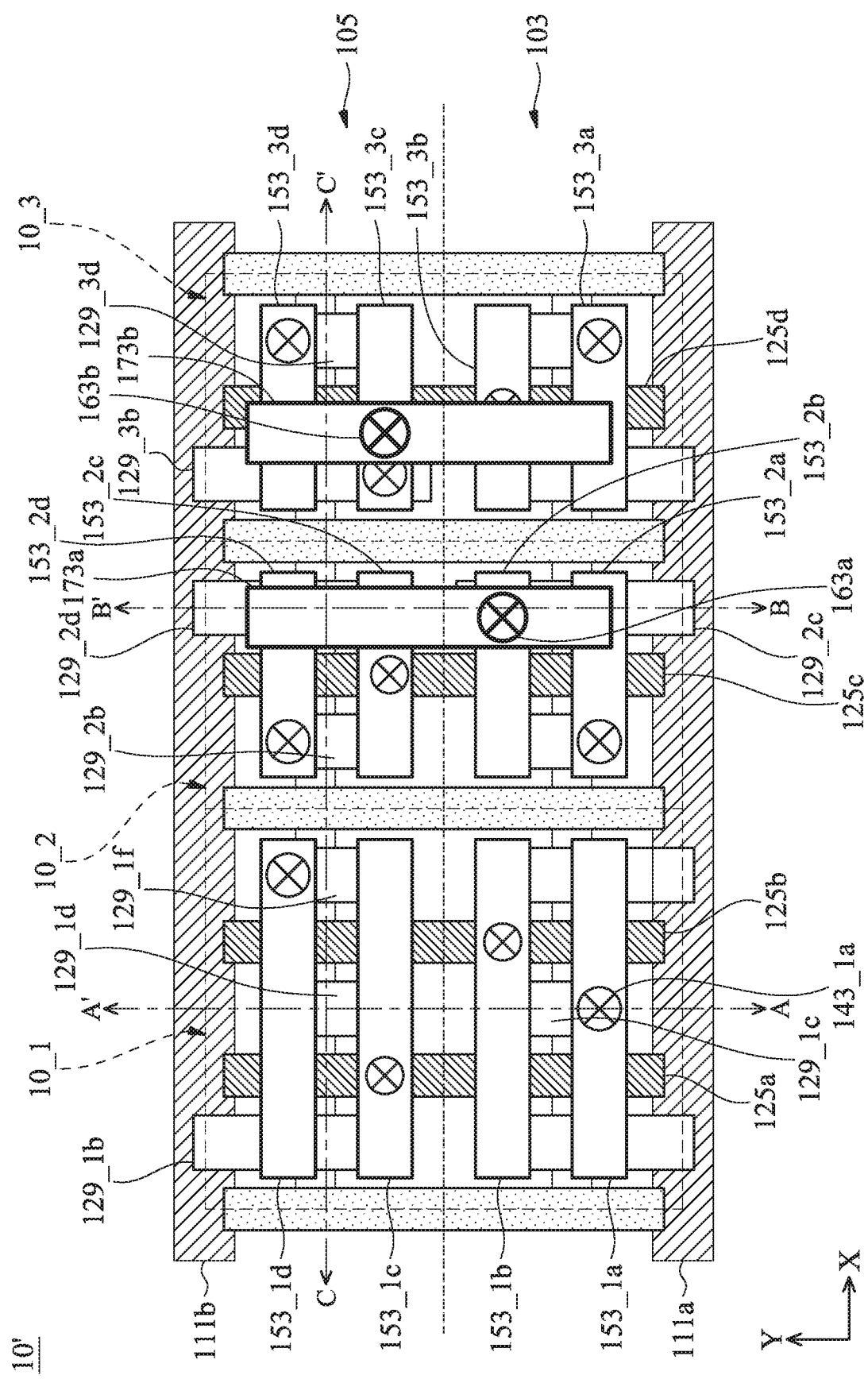

FIGS. 9A to 9C illustrate a layout of features of logic cells in a cell array 10', in accordance with some embodiments of the disclosure. FIGS. 9B and 9C illustrate features in various levels of the cell array 10'.

In FIG. 9A, logic cells 10_1, 10_2 and 10_3 are arranged in the X-direction, and the outer boundary of each of the logic cells 10_1, 10_2 and 10_3 are illustrated using dashed lines. In some embodiments, the standard cell NAND of FIGS. 7A and 7B is implemented in the logic cell 10_1, and the standard cell INV of FIGS. 8A and 8B is implemented in the logic cell 10_2. However, it should be appreciated that embodiments of the disclosure are not limited thereto. For example, in some embodiments, the logic cells 10_1, 10_2 and 10_3 are the standard cells (e.g., INV (inverter), AND, OR, NAND, NOR, Flip-Flop, SCAN, etc.), a combination thereof or specific functional cells.

Moreover, the logic functions of logic cells 10_1, 10_2 and 10_3 may be the same or different. Furthermore, each of the logic cells 10_1, 10_2 and 10_3 includes multiple transistors. In some embodiments, the logic cells 10_1, 10_2 and 10_3 corresponding to the same function or operation may have the same circuit configuration with different semiconductor structures and/or different layouts.

In addition, the transistors of the logic cells 10_1, 10_2 and 10_3 may be single-fin FETs, which are used in non speed-critical circuits to obtain lower leakage and lower power consumption. For example, a single-fin structure (i.e., the fin structure 107a) extending in the X-direction is disposed over the N-type well region 103, and another single-fin structure (i.e., the fin structure 107b) extending in the X-direction is disposed over the P-type well region 105, as shown in FIG. 9A in accordance with some embodiments. However, the embodiments of the disclosure are not limited thereto. In some embodiments, the transistors of the logic cells 10_1, 10_2 and 10_3 are dual-fin FETs, which are used in high-speed circuits. In these cases, each of the fin structure 107a and 107b is replaced by a dual-fin structure.

In the cell array 10' of FIG. 9A, the buried conductive lines 111a and 111b extending in the X-direction are disposed on cell boundaries. In some embodiments, the buried conductive line 111a is a VDD line (i.e., the supply voltage line), and the buried conductive line 111b is a VSS line (i.e., the electrical ground line). A plurality of gate electrodes 125a, 125b, 125c and 125d extending in the Y-direction forms a plurality of PMOS transistors (i.e., the PMOS transistors P1, P2, P3 and P4) with the underlying active region formed by the fin structure 107a, and a plurality of NMOS transistors (i.e., the NMOS transistors N1, N2, N3 and N4) with the underlying active region formed by the fin structure 107b. In other words, each of the gate electrodes 125a, 125b, 125c and 125d is shared by a PMOS transistor over the N-type well region 103 and an NMOS transistor over the P-type well region 105. The details of the gate electrodes 125a to 125d may be similar to the aforementioned gate electrode 125 in FIG. 6, and are not repeated herein for simplicity.

Moreover, in the cell array 10' of FIG. 9A, a plurality of dielectric-base dummy gates 133a, 133b, 133c and 133d extending in the Y-direction are disposed on cell boundaries. Specifically, the dielectric-base dummy gates 133a and 133b are disposed on opposite cell boundaries of the logic cell 10_1, the dielectric-base dummy gates 133b and 133c are disposed on opposite cell boundaries of the logic cell 10_2, and the dielectric-base dummy gates 133c and 133d are disposed on opposite cell boundaries of the logic cell 10_3. In some embodiments, the logic cells 10_1 and 10_2 are isolated (or separated) from each other by the dielectric-base dummy gate 133b, and the logic cells 10_2 and 10_3 are isolated (or separated) from each other by the dielectric-base dummy gate 133c. The details of the dielectric-base dummy gates 133a, 133b, 133c, 133d and 133e will be described in detail later according to FIG. 10C-1.

In some embodiments, the gate electrodes 125a and 125b are disposed between the dielectric-base dummy gates 133a and 133b, the gate electrode 125c is disposed between the dielectric-base dummy gates 133b and 133c, and the gate electrode 125d is disposed between the dielectric-base dummy gates 133c and 133d. Moreover, contacts 129_1a, 129_1b, 129_1c, 129_1d, 129_1e and 129_1f are formed over source/drain structures of the PMOS transistors P1, P2 and the NMOS transistors N1, N2 in the logic cell 10_1, contacts 129_2a, 129_2b, 129_2c and 129_2d are formed over source/drain structures of the PMOS transistor P3 and the NMOS transistor N3 in the logic cell 10_2, and contacts 129_3a, 129_3b, 129_3c and 129_3d are formed over source/drain structures of the PMOS transistor P4 and the NMOS transistor N4 in the logic cell 10_3. The details of the contacts 129_1a to 129_1f, 129_2a to 129_2d, and 129_3a to 129_3d may be similar to the aforementioned contacts 129a to 129h in FIG. 6, and are not repeated herein for simplicity.

In the logic cell 10_1, the source structure of the PMOS transistor P1 is electrically connected to the buried conductive line 111a through the contact 129_1e for electrically connecting the power supply VDD. Similarly, the source structure of the PMOS transistor P2 is electrically connected to the buried conductive line 111a through the contact 129_1a for electrically connecting the power supply VDD. Moreover, the source structure of the NMOS transistor N2 is electrically connected to the buried conductive line 111b through the contact 129_1b for electrically connecting the ground VSS. The drain structures of the PMOS transistors P1 and P2 are electrically connected to an overlying level through the contact 129_1c. The drain structure of the NMOS transistor N1 is electrically connected to an overlying level through the contact 129_1f. In some embodiments, the drain structures of the PMOS transistors P1 and P2 are electrically connected to the drain structure of the NMOS transistor N1 through the contacts 129_1c and 129_1f and the corresponding overlying levels.

In the logic cell 10_2, the source structure of the PMOS transistor P3 is electrically connected to the buried conductive line 111a through the contact 129_2c for electrically connecting the power supply VDD. Moreover, the source structure of the NMOS transistor N3 is electrically connected to the buried conductive line 111b through the contact 129_2d for electrically connecting the ground VSS. The drain structure of the PMOS transistor P3 is electrically connected to an overlying level through the contact 129_2a. The drain structure of the NMOS transistor N3 is electrically connected to an overlying level through the contact 129_2b. In some embodiments, the drain structure of the PMOS transistor P3 is electrically connected to the drain structure of the NMOS transistor N3 through the contacts 129_2a and 129_2b and the corresponding overlying levels. In some embodiments, the drain structures of the PMOS transistor P3 and the NMOS transistor N3 are electrically connected together through the same long contact.

In the logic cell 10_3, the source structure of the PMOS transistor P4 is electrically connected to the buried conductive line 111a through the contact 129_3a for electrically connecting the power supply VDD. Moreover, the source structure of the NMOS transistor N4 is electrically connected to the buried conductive line 111b through the contact 129_3b for electrically connecting the ground VSS. The drain structure of the PMOS transistor P4 is electrically connected to an overlying level through the contact 129_3c. The drain structure of the NMOS transistor N4 is electrically connected to an overlying level through the contact 129_3d. In some embodiments, the drain structure of the PMOS transistor P4 is electrically connected to the drain structure of the NMOS transistor N4 through the contacts 129_3c and 129_3d and the corresponding overlying levels. In some embodiments, the drain structures of the PMOS transistor P4 and the NMOS transistor N4 are electrically connected together through the same long contact.

FIG. 9B further shows a via level and a metal-layer level (i.e., the metal-layer level M1) above the layout of FIG. 9A, in accordance with some embodiments of the disclosure.

In the logic cell 10_1, a gate via 145_1a is disposed over the gate electrode 125a, and a gate via 145_1b is disposed over the gate electrode 125b. The gate electrode 125a is electrically connected to an overlying level through the gate via 145_1a for receiving the input signal IN2 of the standard cell NAND corresponding to the logic cell 10_1, and the gate electrode 125b is electrically connected to an overlying level through the gate via 145_1b for receiving the input signal IN1 of the standard cell NAND corresponding to the logic cell 10_1.

In addition, in the logic cell 10_1, a via 143_1a is disposed over the contact 129_1c, a via 143_1b is disposed over the contact 129_1f, and four conductive lines 153_1a, 153_1b, 153_1c and 153_1d extending in X-direction are disposed within the metal-layer level M1, which is over the level of the vias 143_1a and 143_1b. The conductive line 153_1a is electrically connected to the contact 129_1c through the via 143_1a, the conductive line 153_1b is electrically connected to the gate electrode 125b through the gate via 145_1b, the conductive line 153_1c is electrically connected to the gate electrode 125a through the gate via 145_1a, and the conductive line 153_1d is electrically connected to the contact 129_1f through the via 143_1b.

In the logic cell 10_2, a gate via 145_2a is disposed over the gate electrode 125c. The gate electrode 125c is electrically connected to an overlying level through the gate via 145_2a for receiving the input signal IN of the standard cell INV corresponding to the logic cell 10_2.

In addition, in the logic cell 10_2, a via 143 2a is disposed over the contact 129_2a, a via 143 2b is disposed over the contact 129 2b, a via 143 2c is disposed over the contact 129 2c, and four conductive lines 153 2a, 153 2b, 153 2c and 153 2d extending in X-direction are disposed within the metal-layer level M1, which is over the level of the vias 143_2a, 143 2b and 143 2c. The conductive line 153 2a is electrically connected to the contact 129_2a through the via 143 2a, the conductive line 153 2b is electrically connected to the contact 129 2c through the via 143 2c, the conductive line 153 2c is electrically connected to the gate electrode 125c through the gate via 145 2a, and the conductive line 153_2d is electrically connected to the contact 129 2b through the via 143_2b.

In the logic cell 10_3, a gate via 145_3a is disposed over the gate electrode 125d, and the gate electrode 125d is electrically connected to an overlying level through the gate via 145_3a.

In addition, in the logic cell 10_3, a via 143_3a is disposed over the contact 129_3b, a via 143_3b is disposed over the contact 129_3c, a via 143_3c is disposed over the contact 129_3d, and four conductive lines 153_3a, 153_3b, 153_3c and 153_3d extending in X-direction are disposed within the metal-layer level M1, which is over the level of the vias 143_3a, 143_3b and 143_3c. The conductive line 153_3a is electrically connected to the contact 129_3c through the via 143_3b, the conductive line 153_3b is electrically connected to the gate electrode 125d through the gate via 145_3a, the conductive line 153_3c is electrically connected to the contact 129_3b through the via 143_3a, and the conductive line 153_3d is electrically connected to the contact 129_3d through the via 143_3c.

Furthermore, the materials of the gate vias 145_1a, 145_1b, 145_2a, 145_3a, the vias 143_1a, 143_1b, 143_2a to 143_2c, 143_3a to 143_3c, and the conductive lines 153_1a to 153_1d, 153_2a to 153_2d, 153_3a to 153_3d are similar to the materials of the contacts 129a to 129d in FIG. 1F, and are not repeated herein.

FIG. 9C further shows a via level and a metal-layer level (i.e., the metal-layer level M2) above the layout of FIG. 9B, in accordance with some embodiments of the disclosure.

In the logic cell 10_2, a via 163a is disposed over the conductive line 153_2b, and a conductive line 173a extending in the Y-direction is disposed within the metal-layer level M2, which is over the level of the via 163a. The conductive line 173a is electrically connected to the conductive line 153_2b through the via 163a. Moreover, in the logic cell 10_3, a via 163b is disposed over the conductive line 153_3c, and a conductive line 173b extending in the Y-direction is disposed within the metal-layer level M2, which is over the level of the via 163b. The conductive line 173b is electrically connected to the conductive line 153_3c through the via 163b.

In addition, the materials of the vias 163a, 163b, and the conductive lines 173a, 173b are similar to the materials of the contacts 129a to 129d in FIG. 1F, and are not repeated herein.

Figure 10A:
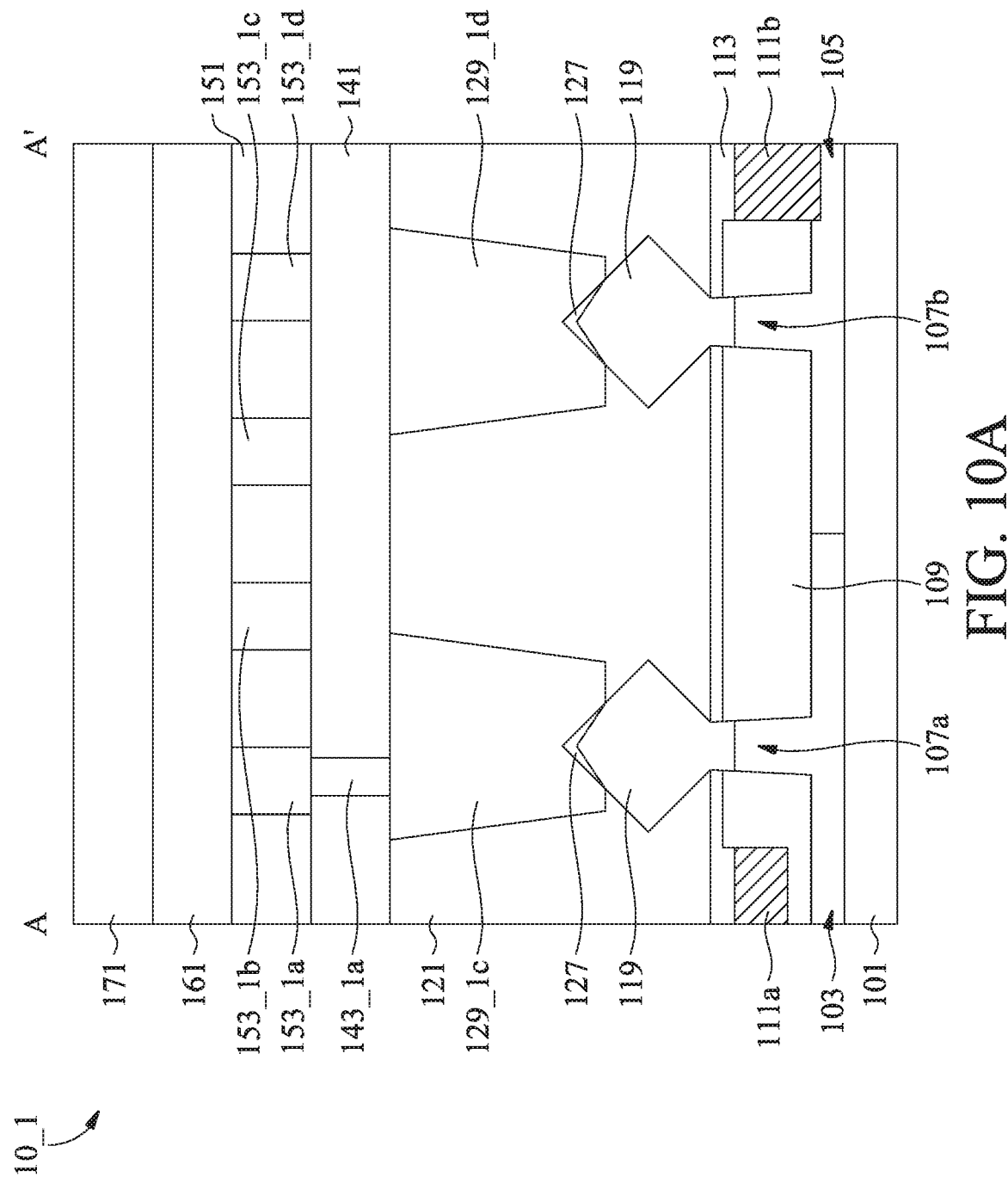
FIG. 10A illustrates a cross-sectional view of the cell array along line A-A' of FIG. 9C, in accordance with some embodiments of the disclosure.
Figure 10B:
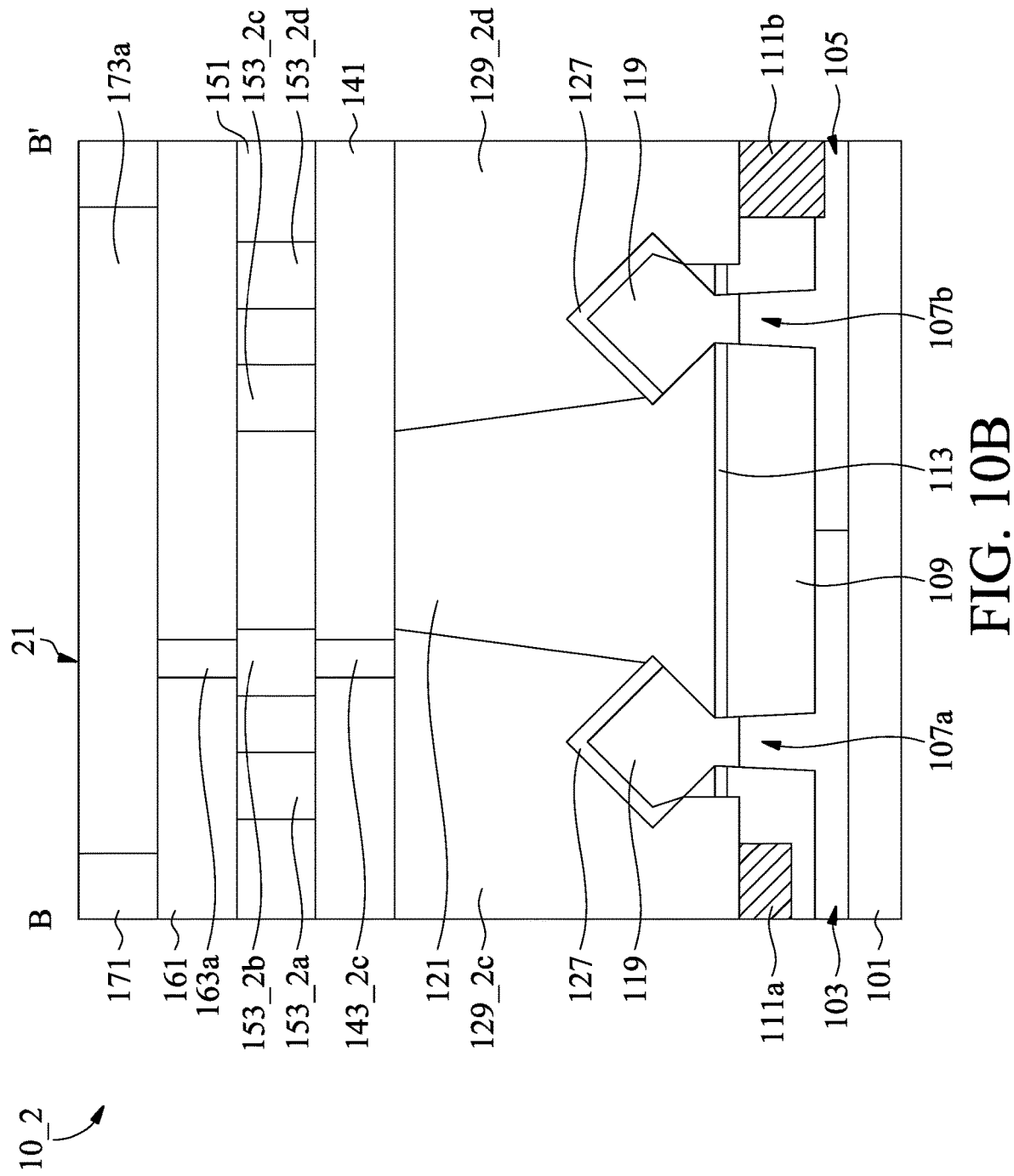
FIG. 10B illustrates a cross-sectional view of the cell array along line B-B' of FIG. 9C, in accordance with some embodiments of the disclosure.
Figures 1, 10C:
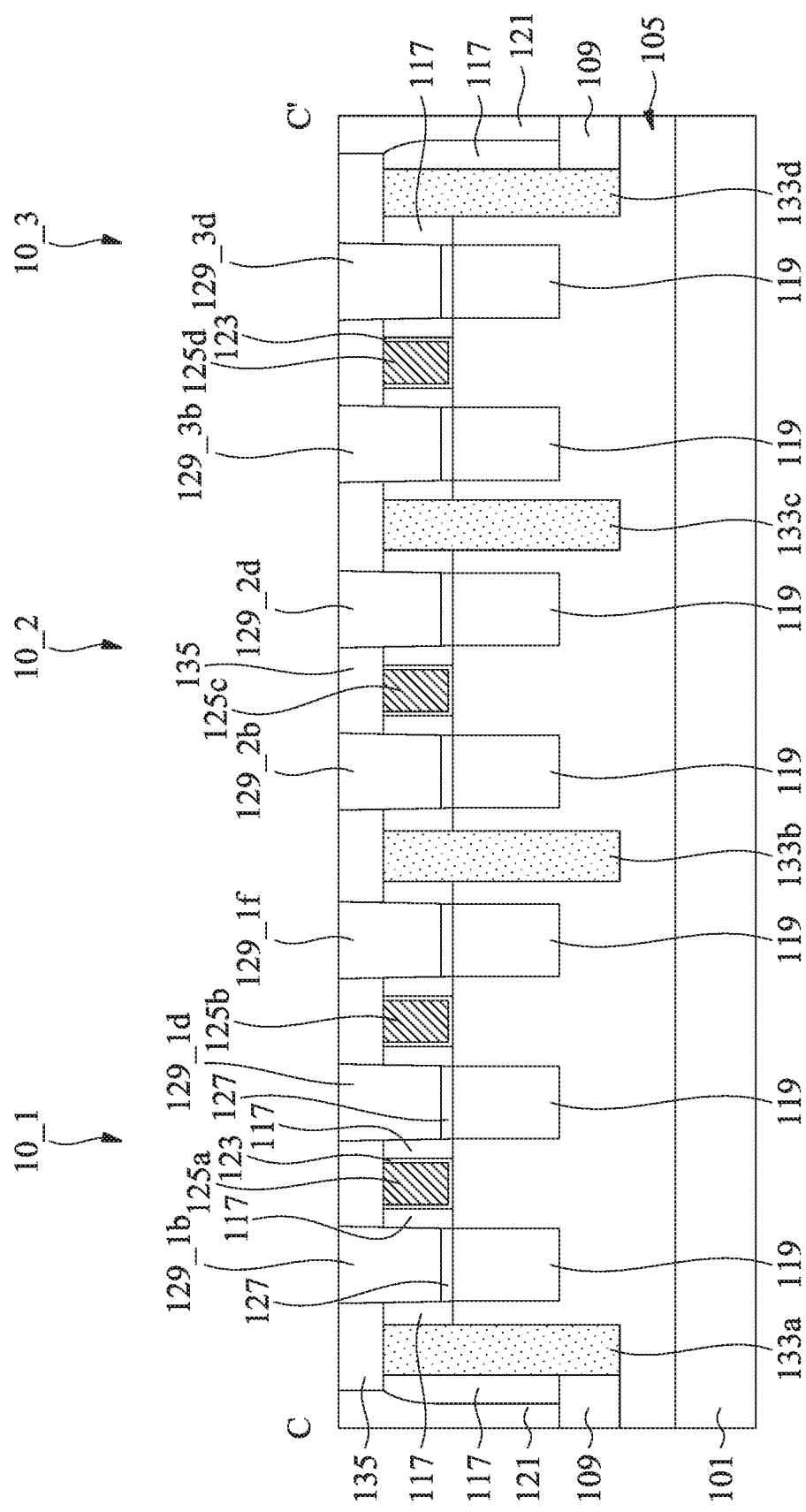
FIG. 10C-1 illustrates a cross-sectional view of the cell array along line C-C' of FIG. 9C, in accordance with some embodiments of the disclosure.

FIG. 10A illustrates a cross-sectional view of the cell array 10' along line A-A' of FIG. 9C, and FIG. 10B illustrates a cross-sectional view of the cell array 10' along line B-B' of FIG. 9C, FIG. 10C-1 illustrates a cross-sectional view of the cell array 10' along line C-C' of FIG. 9C, in accordance with some embodiments of the disclosure.

Referring to FIGS. 9C, 10A, 10B and 10C-1 together, the details of the substrate 101, the N-type well region 103, the P-type well region 105, the fin structures 107a and 107b, the isolation structure 109, the buried conductive lines 111a and 111b, the dielectric capping layer 113, the ILD structure 121, and the silicide layer 127 may be similar to the semiconductor 100a of FIG. 2A, and are not repeated herein for simplicity. In addition, the source/drain structures 119 over the fin structures 107a and 107b may be similar to the drain structures 119a, 119b and the source structures 119c, 119d of the semiconductor 100a shown in FIGS. 2A and 2B and are not repeated herein for simplicity.

The vias 143 1a and 143 2c are formed in (or surrounded by) a dielectric layer 141, the conductive lines 153 1a, 153 1b, 153 1c, 153 1$_d$, 153 2a, 153 2b, 153 2c and 153 2d are formed in (or surrounded by) a dielectric layer 151, the via 163a is formed in (or surrounded by) a dielectric layer 161, and the conductive line 173a is formed in (or surrounded by) a dielectric layer 171, as shown in FIGS. 10A and 10B in accordance with some embodiments. Some materials and processes used to form the dielectric layers 141, 151, 161 and 171 may be similar to, or the same as, those used to form the ILD structure 121 described previously and are not repeated herein.

A strap structure 21 is shown in FIGS. 9C and 10B, which includes the via 143_2c, the conductive line 153_2b, the via 163a and the conductive line 173a. The strap structure 21 (i.e., the VDD power mesh structure) is configured to form an electrical connection between the N-type well region 103, the buried conductive line 111a (i.e., the VDD line) and the corresponding overlying levels. Another strap structure is shown in FIG. 9C, which includes the via 143_3a, the conductive line 153_3c, the via 163b and the conductive line 173b, and the strap structure (i.e., the VSS power mesh structure) is configured to form an electrical connection between the P-type well region 105, the buried conductive line 111b (i.e., the VSS line) and the corresponding overlying levels. These electrical connections are used to help with uniform charge distribution throughout the cell array 10.

By disposing the buried conductive lines 111a and 111b in the isolation structure 109, the strap structures (e.g., the strap structure 21) may be disposed within the logic cells (e.g., the logic cells 10_2 and 10_3) area. Therefore, the area for the well strap cells may be saved.

In addition, the cross-sectional view of the logic cells 10_1, 10_2 and 10_3 is shown in FIG. 10C-1. Each of the dielectric-base dummy gates 133a, 133b, 133c and 133d may include a single layer or multiple layers, and may be made of $SiO_2$, SiOC, SiON, SiOCN, metal oxides (e.g., hafnium oxide ($HfO_2$), tantalum oxide ($Ta_2O_5$), titanium oxide ($TiO_2$), zirconium oxide ($ZrO_2$), aluminum oxide ($Al_2O_3$), yttrium oxide ($Y_2O_3$)), or a combination thereof. Moreover, a plurality of hard masks 135 are formed over the dielectric-base dummy gates 133a, 133b, 133c, 133d and the gate electrodes 125a, 125b, 125c, 125d. The hard masks 135 may be made of oxide, silicon oxide, silicon nitride, silicon carbonitride (SiCN), silicon oxide carbonitride (SiOCN), SiLK, or a combination thereof. In addition, each of the hard masks 135 may be a single layer which is formed by a single deposition process, or multiple layers which are formed by multiple deposition processes.

Figures 2, 10C:
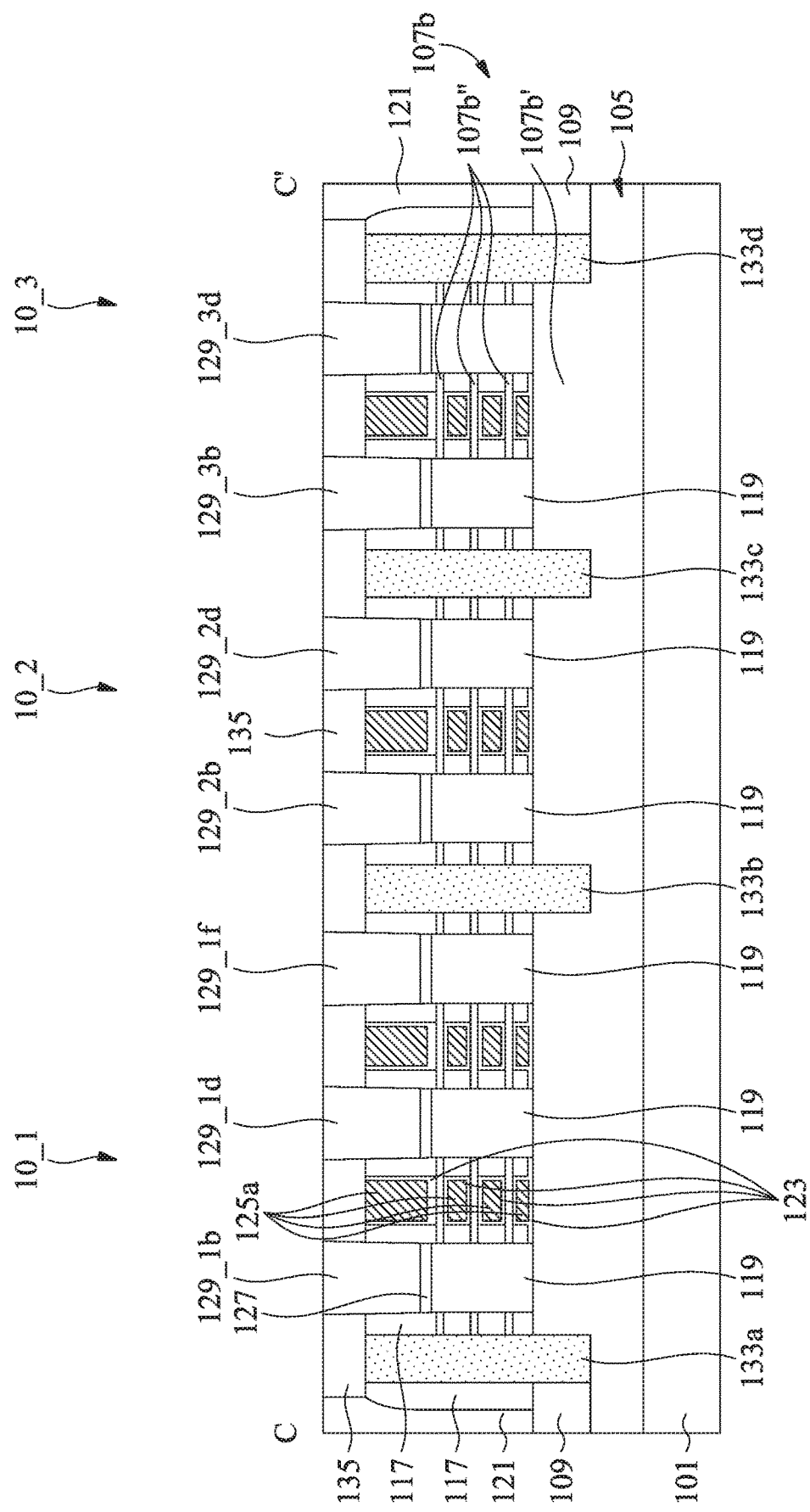

FIG. 10C-2 illustrates a cross-sectional view of the cell array 10' along line C-C' of FIG. 9C, in accordance with some embodiments of the disclosure. Similar to the semiconductor structure 100d of FIG. 5, the fin structure 107b includes a base portion 107b' and a plurality of nanowires 107b" (i.e., channels) over the base portion 107b', as shown in FIG. 10C-2 in accordance with some embodiments. In some embodiments, the transistors (e.g., the NMOS transistors N1, N2, N3 and N4 over the P-type well region 105) are gate-all-around (GAA) transistors. Although FIG. 10C-2 does not illustrate the cross-sectional view of the PMOS transistors P1, P2, P3 and P4 over the N-type well region 103, the PMOS transistors P1, P2, P3 and P4 are gate-all-around (GAA) transistors, in accordance with some embodiments.

Figure 11:
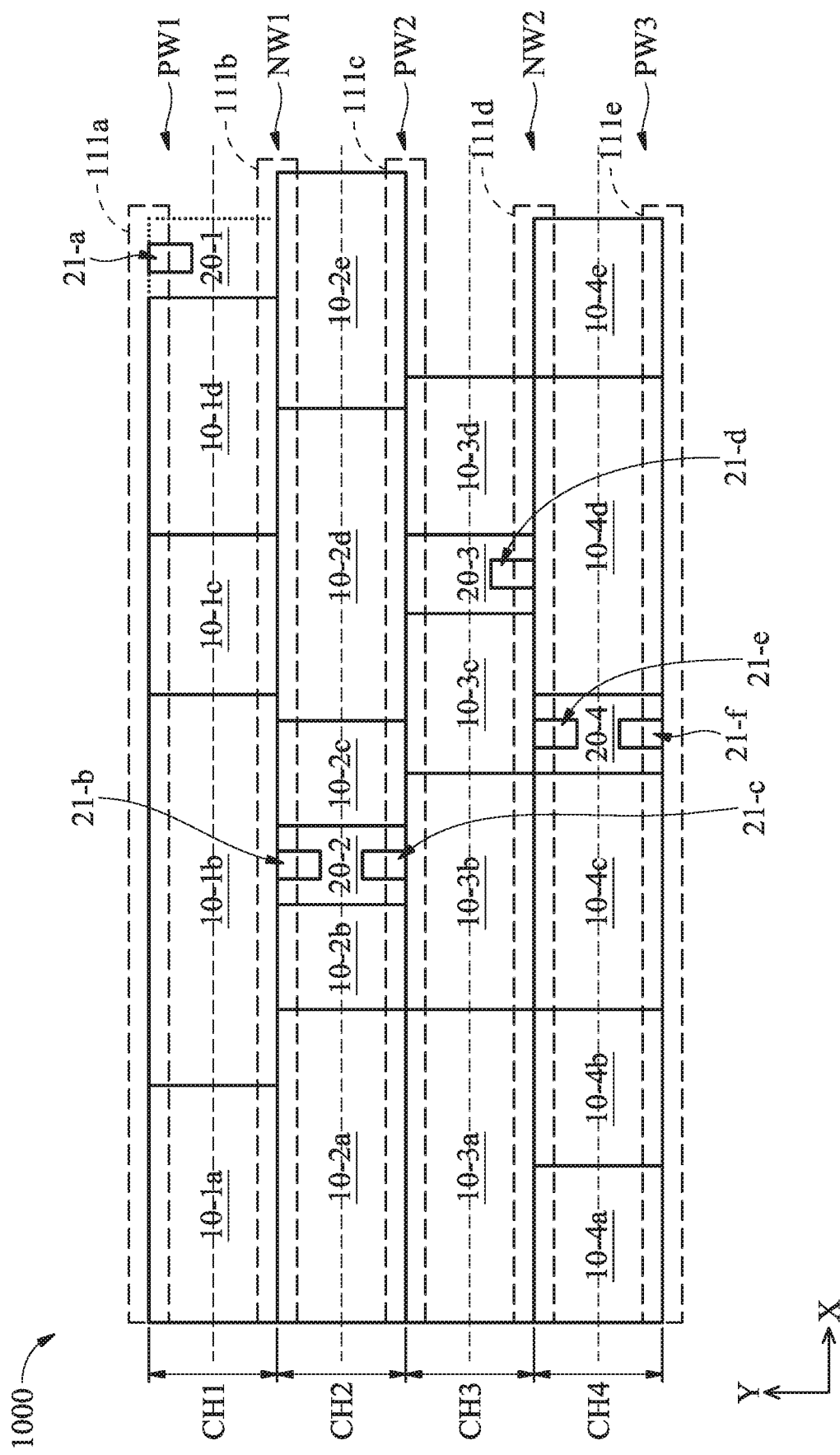
FIG. 11 illustrates a simplified diagram of a cell array, in accordance with some embodiments of the disclosure.

FIG. 11 illustrates a simplified diagram of a cell array 1000, in accordance with some embodiments of the disclosure. The cell array 1000 includes a plurality of logic cells 10-1a, 10-1b, 10-1c, 10-1d, 10-2a, 10-2b, 10-2c, 10-2d, 10-2e, 10-3a, 10-3b, 10-3c, 10-3d, 10-4a, 10-4b, 10-4c, 10-4d and 10-4e. In some embodiments, the logic cells 10-1a to 10-4e are standard cells (e.g., inverter (INV), AND, OR, NAND, NOR, Flip-Flop, SACN, etc.), a combination thereof or specific functional cells.

Moreover, the logic functions of the logic cells 10-1a to 10-4e may be the same or different. For example, the logic cells 10-1a to 10-4e may be the standard cells corresponding to the same logic gates or different logic gates. Furthermore, each of the logic cells 10-1a to 10-4e includes a plurality of transistors. In some embodiments, the logic cells 10-1a to 10-4e corresponding to the same function or operation have the same circuit configuration with different semiconductor structures.

In addition, the cell array 1000 also includes a plurality of filler cells (i.e., dummy cells) 20-1, 20-2, 20-3 and 20-4, as shown in FIG. 11 in accordance with some embodiments. The logic cells 10-1a to 10-1d and the filler cell 20-1 are arranged in the same raw along the X-direction with the same cell height CH1. The filler cell 20-2 is arranged between the logic cells 10-2b and 10-2c, and the logic cells 10-2a to 10-2e and the filler cell 20-2 are arranged in the same raw along the X-direction with the same cell height CH2. The filler cell 20-3 is arranged between the logic cells 10-3c and 10-3d, and the logic cells 10-3a to 10-3d and the filler cell 20-3 are arranged in the same raw along the X-direction with the same cell height CH3. The filler cell 20-4 is arranged between the logic cells 10-4c and 10-4d, and the logic cells 10-4a to 10-4e and the filler cell 20-4 are arranged in the same raw along the X-direction with the same cell height CH4.

The filler cells (i.e., filler cells 20-1, 20-2, 20-3 and 20-4) are IC-designed blocks inserted between two adjacent logic cells to be compatible with IC design and IC fabrication rules. Proper design and configuration of the logic cells and filler cells can enhance packing density and circuit performance. The shapes and sizes of the filler cells 20-1, 20-2, 20-3 and 20-4 are determined according to actual application.

A plurality of buried conductive lines 111a, 111b, 111c, 111d and 111e are arranged along the X-direction in the cell array 1000 of FIG. 11. The details of the buried conductive lines 111a to 111e may be similar to the buried conductive lines 111a and 111b described above, and are not repeated herein for simplicity. In some embodiments, the buried conductive line 111a is over a P-type well region PW1, the buried conductive line 111b is over an N-type well region NW1, the buried conductive line 111c is over a P-type well region PW2, the buried conductive line 111d is over an N-type well region NW2, and the buried conductive line 111e is over a P-type well region PW3.

The details of the P-type well regions PW1, PW2 and PW3 are similar to the P-type well region 105 described above, the details of the N-type well regions NW1 and NW2 are similar to the N-type well region 103, and are not repeated herein for simplicity. Moreover, the buried conductive lines 111a to 111e are arranged on cell boundaries, in accordance with some embodiments.

It should be noted that each of the filler cells 20-1 to 20-4 may include one or more strap structures. For example, the filler cell 20-1 includes a strap structure 21-a electrically connected to the P-type well region PW1, the buried conductive line 111a (i.e., the VSS line) and the overlying metal-layer levels, such as the metal-layer level M3 over the metal-layer level M2, as shown in FIG. 11 in accordance with some embodiments.

Moreover, in some embodiments, the filler cell 20-2 includes a strap structure 21-b electrically connected to the N-type well region NW1, the buried conductive line 111b (i.e., the VDD line) and the overlying metal-layer levels, and the filler cell 20-2 also includes a strap structure 21-c electrically connected to the P-type well region PW2, the buried conductive line 111c (i.e., the VSS line) and the overlying metal-layer levels.

Furthermore, in some embodiments, the filler cell 20-3 includes a strap structure 21-d electrically connected to the N-type well region NW2, the buried conductive line 111d (i.e., the VDD line) and the overlying metal-layer levels. In addition, the filler cell 20-4 includes a strap structure 21-e electrically connected to the N-type well region NW2, the buried conductive line 111d and the overlying metal-layer levels, and the filler cell 20-4 also includes a strap structure 21-f electrically connected to the P-type well region PW3, the buried conductive line 111e (i.e., the VSS line) and the overlying metal-layer levels, as shown in FIG. 11 in accordance with some embodiments.

In other words, the strap structures 21-a, 21-c, 21-f are VSS power mesh structures, and the strap structures 21-b, 21-d and 21-e are VDD power mesh structures. The details of the strap structures 21-a to 21-f may be similar to the strap structure 21 described in FIGS. 9C and 10B, and are not repeated herein for simplicity.

One of the differences between the cell array 1000 of FIG. 11 and the cell array 10' of FIG. 9C is the location of the strap structures. In some embodiments, the strap structures are arranged within the logic cells, such as the strap structure 21 arranged in the logic cell 10_2 as shown in FIGS. 9C and 10B. In some embodiments, the strap structures are arranged within the filler cells between the logic cells, such as the strap structures 21-1 to 21-f as shown in FIG. 11. In addition, by disposing the strap structures in the filler cells, the areas occupied by the filler cells may be utilized efficiently. The numbers of the strap structures in each filler cells are not limited.

Figure 12A:
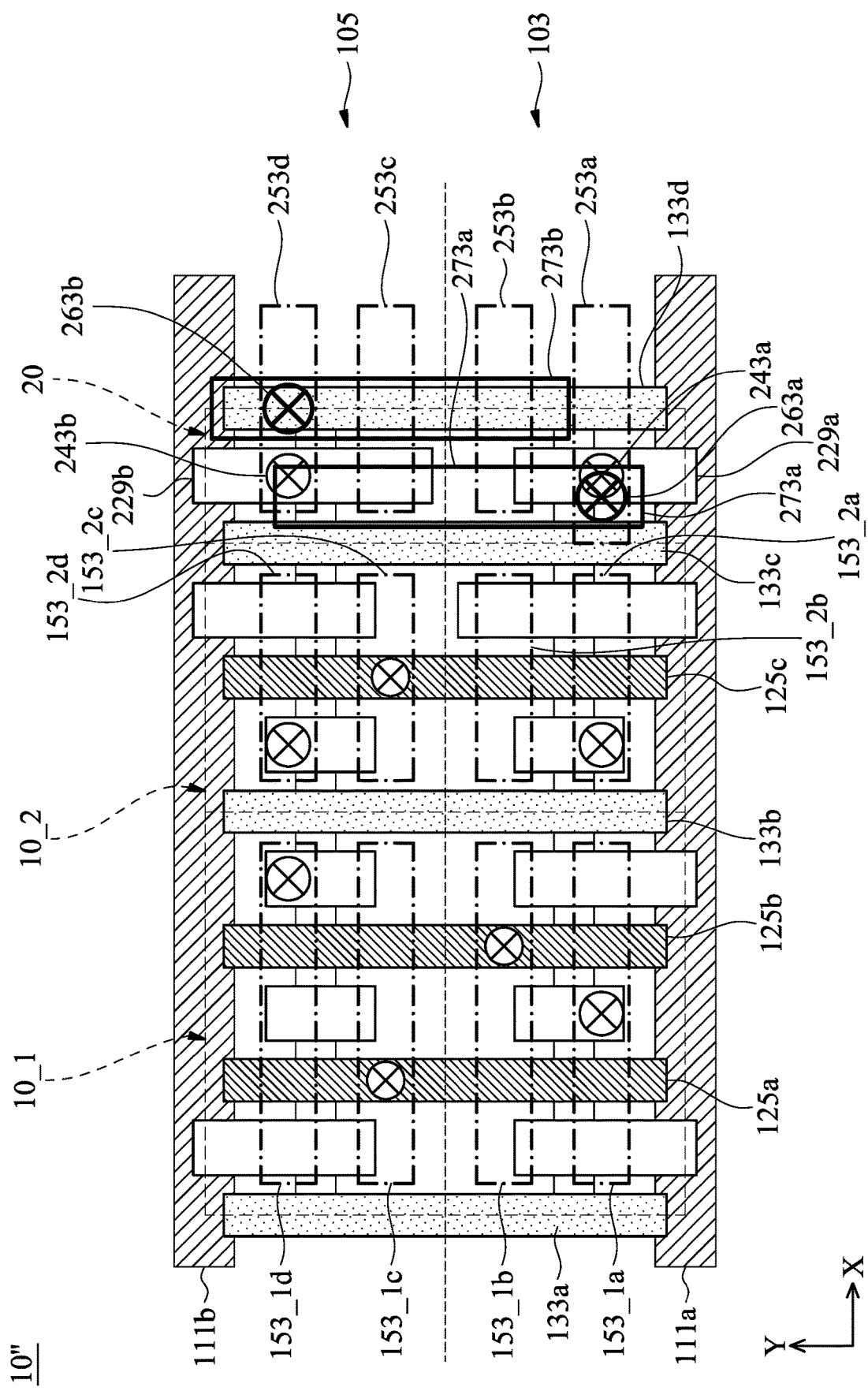
FIG. 12A illustrates a layout of features of logic cells in a cell array, in accordance with some embodiments of the disclosure.

FIG. 12A illustrates a layout of features of logic cells in a cell array 10", in accordance with some embodiments of the disclosure. In FIG. 12A, logic cells 10_1, 10_2 and a filler cell 20 are arranged in the X-direction, and the outer boundary of each of the logic cells 10_1, 10_2 and the filler cell 20 are illustrated using dashed lines. In some embodiments, the standard cell NAND of FIGS. 7A and 7B is implemented in the logic cell 10_1, and the standard cell INV of FIGS. 8A and 8B is implemented in the logic cell 10_2. The conductive lines 153-1a to 153-1d and 153-2a to 153-2d of FIG. 12A are illustrated using dot-dashed lines, and the underlying layers are not covered by the conductive lines 153-1a to 153-1d and 153-2a to 153-2d of FIG. 12A for clarification.

In FIG. 12A, the dielectric-base dummy gates 133c and 133d extending in Y-direction are disposed on cell boundaries of the filler cell 20. A VDD strap structure is formed within the filler cell 20. In some embodiments, the VDD strap structure includes a via 243a, a conductive line 253a extending in the X-direction, a via 263a and a conductive line 273a extending in the Y-direction from the bottom to the top, and the VDD strap structure is configured to form an electrical connection between the N-type well region 103, the buried conductive line 111a (i.e., the VDD line), a contact 229a extending in the Y-direction, and the corresponding overlying levels.

Moreover, a VSS strap structure is formed within the filler cell 20. In some embodiments, the VSS strap structure includes a via 243b, a conductive line 253d extending in the X-direction, a via 263b and a conductive line 273b extending in the Y-direction from the bottom to the top, and the VSS strap structure is configured to form an electrical connection between the P-type well region 105, the buried conductive line 111b (i.e., the VSS line), a contact 229b extending in the Y-direction, and the corresponding overlying levels. In addition, the filler cell 20 also includes conductive lines 253b and 253c disposed in the same metal-layer level as the conductive lines 253a and 253d (i.e., the metal-layer level M1).

Figure 12B:
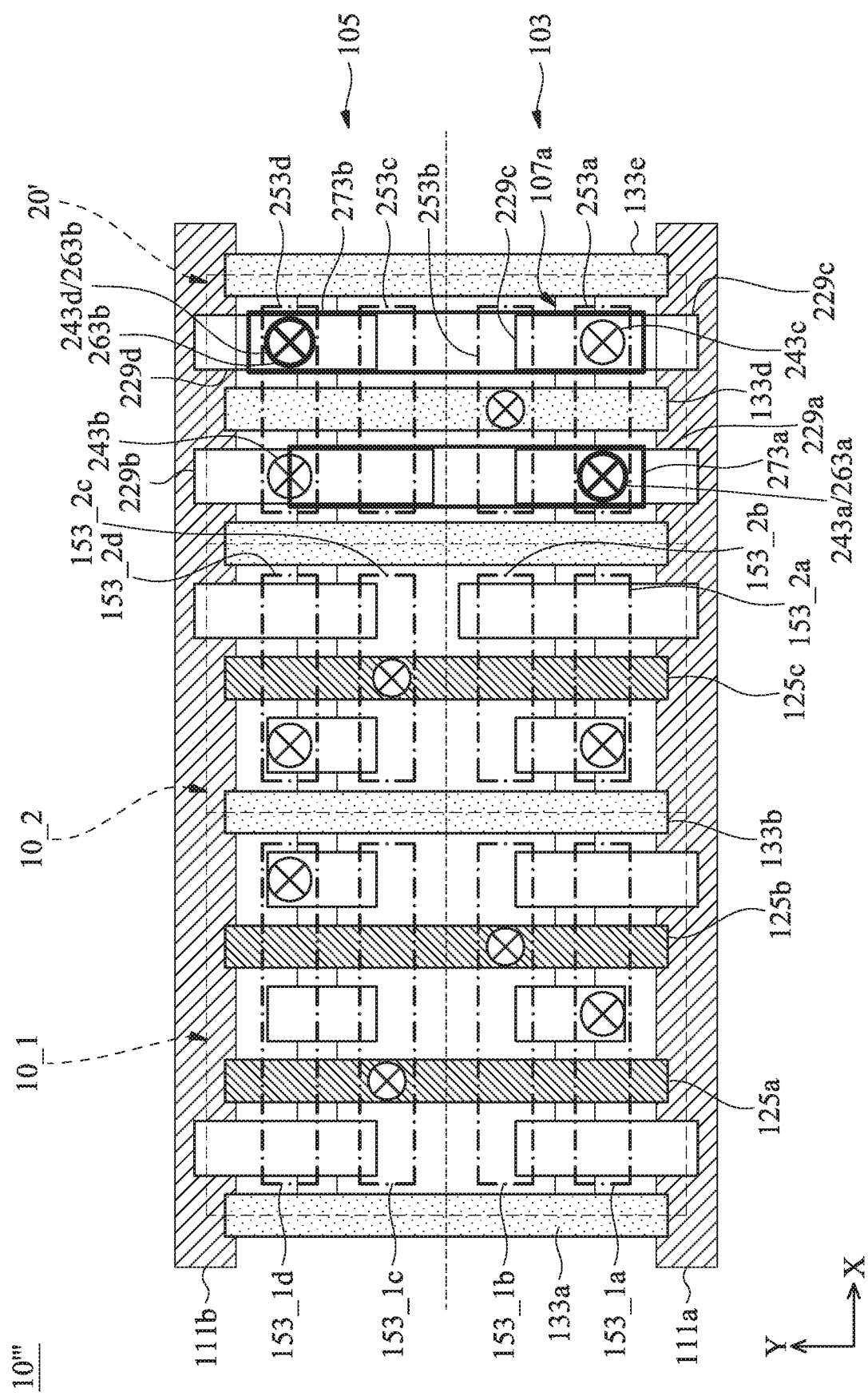
FIG. 12B illustrates a layout of features of logic cells in a cell array, in accordance with some embodiments of the disclosure.

FIG. 12B illustrates a layout of features of logic cells in a cell array 10′″, in accordance with some embodiments of the disclosure. In FIG. 12B, logic cells 10_1, 10_2 and a filler cell 20′ are arranged in the X-direction, and the outer boundary of each of the logic cells 10_1, 10_2 and the filler cell 20′ are illustrated using dashed lines. Some details of the logic cells 10_1 and 10_2 of FIG. 12B are similar to, or the same as that of the logic cells 10_1 and 10_2 of FIG. 12A and are not repeated herein. The difference between the cell array 10′″ and the cell array 10″ is the structure of the filler cells.

In FIG. 12B, the dielectric-base dummy gate 133c and another dielectric-base dummy gate 133e extending in Y-direction are disposed on cell boundaries of the filler cell 20′, and the dielectric-base dummy gate 133d extending in Y-direction is disposed between the dielectric-base dummy gates 133c and 133e. It should be noted that a VDD strap structure is formed within the filler cell 20′. In some embodiments, the VDD strap structure includes a via 243a (overlap with an overlying via 263a in FIG. 12B), a conductive line 253a extending in the X-direction, the via 263a and a conductive line 273a extending in the Y-direction from the bottom to the top, and the VDD strap structure is configured to form an electrical connection between the N-type well region 103, the buried conductive line 111a (i.e., the VDD line), a contact 229a extending in the Y-direction, and the corresponding overlying levels.

Moreover, a VSS strap structure is formed within the filler cell 20′. In some embodiments, the VSS strap structure includes a via 243d (overlap with an overlying via 263b in FIG. 12B), a conductive line 253d extending in the X-direction, the via 263b and a conductive line 273b extending in the Y-direction from the bottom to the top, and the VSS strap structure is configured to form an electrical connection between the P-type well region 105, the buried conductive line 111b (i.e., the VSS line), a contact 229d extending in the Y-direction, and the corresponding overlying levels. In addition, the filler cell 20′ also includes contacts 229b, 229c, and conductive lines 253b and 253c disposed in the same metal-layer level as the conductive lines 253a and 253d (i.e., the metal-layer level M1).

By disposing the strap structures (e.g., the VDD and VSS strap structures) in the filler cells (e.g., the filler cell 20 of FIG. 12A and the filler cell 20′ of FIG. 12B), the area occupied by the filler cells may be utilized efficiently. Moreover, the sizes and the semiconductor structures of each filler cells are not limited. For example, the filler cell 20 of the cell array 10″ in FIG. 12A has two dielectric-base dummy gates, and the filler cell 20′ of the cell array 10′″ in FIG. 12B has three dielectric-base dummy gates.

The size of the filler cell 20′ in FIG. 12B is greater than the size of the filler cell 20 in FIG. 12A. However, it should be appreciated that embodiments of the disclosure are not limited thereto. For example, there may be more than three dielectric-base dummy gates in a single filler cell.

Embodiments of a semiconductor structure and methods for forming the same are provided. The semiconductor structure may include a first well region over a substrate, and an isolation structure and a first transistor over the first well region. The semiconductor structure may also include a first buried conductive line over the first well region and electrically connected to a source structure of the first transistor, and the top surface of the first buried conductive line is substantially level with or lower than the top surface of the isolation structure. By using the first buried conductive line to electrically connect the source structure of the first transistor, the overlying metal-layer level area may be saved, such that the routing flexibility may be improved.

Moreover, the lower well pickup resistance may be obtained by disposing the first buried conductive line connected to the first well region, thus obtaining better latch up immunity as well as saving well strap area. As a result, routing efficiency and logic circuit density improvement are increased for the standard cells.

In addition, by disposing the first buried conductive line in the isolation structure, the strap structure(s) may be disposed within logic cells or filler cells. Therefore, the area for the well strap cells may be saved, and the areas occupied by the filler cells may be utilized efficiently.

In some embodiments, a semiconductor structure is provided. The semiconductor structure includes a first well region over a substrate, and an isolation structure over the first well region. The semiconductor structure also includes a first transistor over the first well region, and a first buried conductive line over the first well region and electrically connected to a source structure of the first transistor. A top surface of the first buried conductive line is substantially level with or lower than a top surface of the isolation structure.

In some embodiments, a semiconductor structure is provided. The semiconductor structure includes an N-type well region and a P-type well region over a substrate. The P-type well region adjoins the N-type well region. The semiconductor structure also includes an isolation structure over the N-type well region and the P-type well region, and a PMOS transistor and a first buried conductive line over the N-type well region. The semiconductor structure further includes a first contact over a source structure of the PMOS transistor. A portion of the first buried conductive line overlaps the first contact. In addition, the semiconductor structure includes an NMOS transistor and a second buried conductive line over the P-type well region. The PMOS transistor and the NMOS transistor share a gate structure.

In some embodiments, a method for forming a semiconductor structure is provided. The method for forming a semiconductor structure includes forming a first molding compound layer surrounding a first interposer, and forming a first well region in a substrate, and forming a first fin structure over the first well region. The method for forming a semiconductor structure also includes forming an isolation structure over the first well region. The first fin structure protrudes from the isolation structure. The method for forming a semiconductor structure further includes partially removing the isolation structure to form a first trench over the first well region. The first trench and the first fin structure are parallel to each other, and the first well region is exposed by the first trench. In addition, the method for forming a semiconductor structure includes forming a first buried conductive line in the first trench, and forming a first transistor over the first well region after the first buried conductive line is formed. The first buried conductive line is electrically connected to a source structure of the first transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first well region over a substrate;
an isolation structure over the first well region;
a first transistor over the first well region, wherein the first transistor comprises a gate structure and a gate spacer over sidewalls of the gate structure; and
a first buried conductive line over the first well region and electrically connected to a source structure of the first transistor, wherein a top surface of the first buried conductive line is substantially level with or lower than a top surface of the isolation structure, and wherein a portion of the first buried conductive line is covered by the gate spacer.

2. The semiconductor structure as claimed in claim 1, wherein the first transistor further comprises:
a fin structure protruding from the isolation structure, wherein the fin structure is covered by the gate structure.

3. The semiconductor structure as claimed in claim 1, further comprising:
a second well region over the substrate, wherein the second well region adjoins the first well region, and the isolation structure is over the second well region;
a second transistor over the second well region; and
a second buried conductive line over the second well region and electrically connected to a source structure of the second transistor, wherein the second buried conductive line is parallel to the first buried conductive line.

4. The semiconductor structure as claimed in claim 3, wherein the first well region is p-type and the second well region is n-type, and
wherein the first buried conductive line is embedded in the isolation structure, and a portion of the isolation structure is sandwiched between the second buried conductive line and the second well region.

5. The semiconductor structure as claimed in claim 3, wherein the first well region is p-type and the second well region is n-type, and
wherein the first buried conductive line and the second buried conductive line are embedded in the isolation structure and contact the first well region and the second well region respectively.

6. The semiconductor structure as claimed in claim 1, further comprising:
a first contact over the source structure of the first transistor, wherein the source structure of the first transistor is electrically connected to the first buried conductive line through the first contact.

7. A semiconductor structure, comprising:
an N-type well region and a P-type well region over a substrate, wherein the P-type well region adjoins the N-type well region;
an isolation structure over the N-type well region and the P-type well region;
a PMOS transistor and a first buried conductive line over the N-type well region, wherein a portion of the isolation structure is sandwiched between the first buried conductive line and the N-type well region;
a first contact over a source structure of the PMOS transistor, wherein a portion of the first buried conductive line overlaps the first contact; and
an NMOS transistor and a second buried conductive line over the P-type well region, wherein the PMOS transistor and the NMOS transistor share a gate structure.

8. The semiconductor structure as claimed in claim 7, wherein the first buried conductive line is electrically connected to the source structure of the PMOS transistor through the first contact, and a bottom surface of the first buried conductive line is higher than a bottom surface of the isolation structure.

9. The semiconductor structure as claimed in claim 7, further comprising:
a second contact over a source structure of the NMOS transistor, wherein the second buried conductive line is electrically connected to the source structure of the NMOS transistor through the second contact, and a portion of the second buried conductive line is covered by the second contact.

10. The semiconductor structure as claimed in claim 7, further comprising:
an inter-layer dielectric (ILD) structure surrounding the first contact; and
a strap structure over the ILD structure and electrically connected to the first contact, wherein the strap structure comprises a first via, a first conductive line over the first via, a second via over the first conductive line, and a second conductive line over the second via.

11. The semiconductor structure as claimed in claim 10, wherein the PMOS transistor, the NMOS transistor and the strap structure are arranged in a logic cell, and the strap structure overlaps the first contact in a top view.

12. The semiconductor structure as claimed in claim 10, further comprising:
a logic cell, wherein the PMOS transistor and the NMOS transistor are arranged in the logic cell; and a filler cell adjacent to the logic cell, wherein the filler cell is between a first dielectric-base dummy gate and a second dielectric-base dummy gate, and the strap structure is arranged in the filler cell in a top view.

13. A method for forming a semiconductor structure, comprising:

forming a first well region in a substrate;

forming a first fin structure over the first well region;

forming an isolation structure over the first well region, wherein the first fin structure protrudes from the isolation structure;

partially removing the isolation structure to form a first trench over the first well region, wherein the first trench and the first fin structure are parallel to each other, and the first well region is exposed by the first trench;

forming a first buried conductive line in the first trench, wherein the first buried conductive line extends into a top portion of the first well region; and forming a first transistor over the first well region after the first buried conductive line is formed, wherein the first buried conductive line is electrically connected to a source structure of the first transistor.

14. The method for forming the semiconductor structure as claimed in claim 13, further comprising:

forming a dielectric capping layer covering the first buried conductive line and the isolation structure before the source structure of the first transistor is formed.

15. The method for forming the semiconductor structure as claimed in claim 13, further comprising:

forming a second well region adjacent to the first well region;

forming a second fin structure over the second well region, wherein the second fin structure protrudes from the isolation structure;

partially removing the isolation structure to form a second trench over the second well region, wherein the second trench is parallel to the first trench;

forming a second buried conductive line in the second trench; and forming a second transistor over the second well region after the second buried conductive line is formed, wherein the second buried conductive line is electrically connected to a source structure of the second transistor.

16. The method for forming the semiconductor structure as claimed in claim 15, wherein the first transistor is an NMOS, the second transistor is a PMOS, and a bottom surface of the second trench is higher than a bottom surface of the first trench.

17. The method for forming the semiconductor structure as claimed in claim 15, wherein forming the first transistor further comprises:

forming a dummy gate structure across the first fin structure and the second fin structure; and forming a gate spacer surrounding the dummy gate structure before the source structure of the first transistor is formed, wherein the first buried conductive line and the second buried conductive line are partially covered by the gate spacer.

18. The method for forming the semiconductor structure as claimed in claim 13, further comprising:

forming an inter-layer dielectric (ILD) structure covering the source structure of the first transistor;

partially removing the ILD structure to expose the first buried conductive line, and the source structure of the first transistor; and forming a first contact over the source structure of the first transistor, wherein the source structure of the first transistor is electrically connected to the first buried conductive line through the first contact.

19. The method for forming the semiconductor structure as claimed in claim 18, further comprising:

forming a first dielectric layer over the ILD structure;

forming a first via penetrating through the first dielectric layer;

forming a second dielectric layer over the first dielectric layer;

forming a first conductive line penetrating through the second dielectric layer, wherein the first conductive line is parallel to the first buried conductive line;

forming a third dielectric layer over the second dielectric layer; and forming a second via penetrating through the third dielectric layer, wherein the second via is electrically connected to the first contact through the first conductive line and the first via.

20. The method for forming the semiconductor structure as claimed in claim 13, wherein the first buried conductive line is not connected to a drain structure of the first transistor.

* * * * *